US012566899B2

(12) United States Patent
Lachinski et al.

(10) Patent No.: US 12,566,899 B2
(45) Date of Patent: Mar. 3, 2026

(54) SHARED GEOGRAPHIC INFORMATION SYSTEM FOR CREATION, CHANGE MANAGEMENT AND DELIVERY OF 3D STRUCTURE MODELS

(71) Applicant: GeoSpan Corporation, Maple Grove, MN (US)

(72) Inventors: Theodore M. Lachinski, Andover, MN (US); Stephen Boggs, Fridley, MN (US); Nishalan Nair Revi Andran, Minneapolis, MN (US); Grant W. Effertz, Bloomington, MN (US)

(73) Assignee: GeoSpan Corporation, Maple Grove, MN (US)

( * ) Notice: Subject to any disclaimer, the term of this patent is extended or adjusted under 35 U.S.C. 154(b) by 351 days.

(21) Appl. No.: 16/725,291

(22) Filed: Dec. 23, 2019

(65) Prior Publication Data

US 2020/0202049 A1 Jun. 25, 2020

Related U.S. Application Data

(60) Provisional application No. 62/783,803, filed on Dec. 21, 2018.

(51) Int. Cl.
*G06F 30/13* (2020.01)
*G06F 16/29* (2019.01)
(Continued)

(52) U.S. Cl.
CPC .............. *G06F 30/13* (2020.01); *G06F 16/29* (2019.01); *G06F 16/5866* (2019.01);
(Continued)

(58) Field of Classification Search
CPC ...... G06F 30/13; G06F 16/29; G06F 16/5866; G06F 16/587; G06Q 30/0201;
(Continued)

(56) References Cited

U.S. PATENT DOCUMENTS 5,633,946 A * 5/1997 Lachinski ................. G06T 7/66
701/532
7,139,720 B1 * 11/2006 Foell ................ G06Q 10/06314
705/7.22

(Continued)

OTHER PUBLICATIONS

"What is Active Measurement", IGI Global, Retrieved Apr. 4, 2022 from https://www.igi-global.com/dictionary/active-measurement/424 ( Year: 2022).*

(Continued)

*Primary Examiner* — Rehana Perveen
*Assistant Examiner* — Troy A Maust
(74) *Attorney, Agent, or Firm* — Kinney & Lange, P .A.

(57) ABSTRACT

A new generation 3D modeling system is described for the management of the 3D characteristics of man-made structures in a shared geographic information system (GIS) platform. The system accommodates the conversion of 2D GIS topology to 3D real-world topology, originate and perpetually maintain 3D models and non-graphical attribute data through time managed by a community of users based on a series of permissions and user roles. The system integrates 3D model data with attribute data and may be supplemented with published map or attribute data and/or data made available by users of the system.

34 Claims, 27 Drawing Sheets

(51) Int. Cl.

| | |
|---|---|
| *G06F 16/58* | (2019.01) |
| *G06Q 30/0201* | (2023.01) |
| *G06Q 30/0283* | (2023.01) |
| *G06T 17/05* | (2011.01) |
| *G06T 17/20* | (2006.01) |
| *G06T 19/20* | (2011.01) |
| *H04N 13/204* | (2018.01) |

(52) U.S. Cl.
CPC ..... *G06Q 30/0201* (2013.01); *G06Q 30/0283* (2013.01); *G06T 17/05* (2013.01); *G06T 17/20* (2013.01); *G06T 19/20* (2013.01); *H04N 13/204* (2018.05); *G06T 2219/2024* (2013.01)

(58) Field of Classification Search
CPC ..... G06Q 30/0283; G06T 17/05; G06T 17/20; G06T 19/20; G06T 2219/2024; H04N 13/204
USPC .......................................................... 703/1
See application file for complete search history.

(56) References Cited

U.S. PATENT DOCUMENTS

| | | | |
|---|---|---|---|
| 7,425,958 B2 | 9/2008 | Berger et al. | |
| 7,728,833 B2 | 6/2010 | Verma et al. | |
| 8,078,436 B2 | 12/2011 | Pershing et al. | |
| 8,145,578 B2 | 3/2012 | Pershing et al. | |
| 8,170,840 B2 | 5/2012 | Pershing | |
| 8,209,152 B2 | 6/2012 | Pershing | |
| 8,339,394 B1 | 12/2012 | Lininger | |
| 8,401,222 B2 | 3/2013 | Thornberry et al. | |
| 8,515,125 B2 | 8/2013 | Thornberry et al. | |
| 8,542,880 B2 | 9/2013 | Thornberry et al. | |
| 8,593,518 B2 | 11/2013 | Schultz et al. | |
| 8,670,961 B2 | 3/2014 | Pershing et al. | |
| 8,731,234 B1 | 5/2014 | Pershing et al. | |
| 8,732,599 B2 * | 5/2014 | Reghetti ................. | G06T 19/20 |
| | | | 715/765 |
| 8,774,525 B2 | 7/2014 | Pershing | |
| 8,818,770 B2 | 8/2014 | Pershing | |
| 8,825,454 B2 | 9/2014 | Pershing | |
| 8,938,090 B2 | 1/2015 | Thornberry et al. | |
| 8,995,757 B1 | 3/2015 | Ciarcia et al. | |
| 9,070,018 B1 | 6/2015 | Ciarcia et al. | |
| 9,129,376 B2 | 9/2015 | Pershing | |
| 9,135,737 B2 | 9/2015 | Pershing | |
| 9,141,880 B2 | 9/2015 | Ciarcia | |
| 9,147,287 B2 | 9/2015 | Ciarcia | |
| 9,159,164 B2 | 10/2015 | Ciarcia | |
| 9,244,589 B2 | 1/2016 | Thornberry et al. | |
| 9,329,749 B2 | 5/2016 | Thornberry et al. | |
| 9,514,568 B2 | 12/2016 | Pershing et al. | |
| 9,514,717 B2 * | 12/2016 | Purayil .................. | G06F 3/048 |
| 9,542,417 B2 | 1/2017 | Hieronymus et al. | |
| 9,599,466 B2 | 3/2017 | Pershing | |
| 9,679,227 B2 | 6/2017 | Taylor et al. | |
| 9,782,936 B2 | 10/2017 | Glunz et al. | |
| 9,817,922 B2 | 11/2017 | Glunz et al. | |
| 9,911,228 B2 | 3/2018 | Pershing et al. | |
| 9,933,254 B2 | 4/2018 | Thornberry et al. | |
| 9,933,257 B2 | 4/2018 | Pershing | |
| 9,953,370 B2 | 4/2018 | Pershing et al. | |
| 9,959,581 B2 | 5/2018 | Pershing | |
| 10,140,758 B1 * | 11/2018 | Klein .................... | G06T 11/001 |
| 10,197,391 B2 | 2/2019 | Thornberry et al. | |
| 10,515,414 B2 | 12/2019 | Pershing | |
| 10,528,960 B2 | 1/2020 | Pershing et al. | |
| 10,648,800 B2 | 5/2020 | Thornberry et al. | |
| 10,663,294 B2 | 5/2020 | Pershing et al. | |
| 10,671,648 B2 | 6/2020 | Barrow et al. | |
| 10,684,149 B2 | 6/2020 | Koenig | |
| 10,839,469 B2 | 11/2020 | Pershing | |
| 10,861,247 B2 | 12/2020 | Milbert et al. | |
| 11,060,857 B2 | 7/2021 | Thornberry et al. | |
| 2009/0234692 A1 | 9/2009 | Powell et al. | |
| 2010/0217566 A1 | 8/2010 | Wayne et al. | |
| 2012/0331002 A1 | 12/2012 | Carrington | |
| 2013/0113797 A1 | 5/2013 | Mitrakis et al. | |
| 2013/0218890 A1 * | 8/2013 | Fernandes ............... | G06F 16/29 |
| | | | 707/736 |
| 2013/0222369 A1 | 8/2013 | Huston et al. | |
| 2013/0226515 A1 | 8/2013 | Pershing et al. | |
| 2014/0043436 A1 * | 2/2014 | Bell ...................... | H04N 13/246 |
| | | | 348/46 |
| 2016/0036972 A1 * | 2/2016 | Ristock ............... | H04M 3/5175 |
| | | | 379/266.1 |
| 2017/0091578 A1 | 3/2017 | Ananthakrishnan et al. | |
| 2017/0177748 A1 | 6/2017 | High et al. | |
| 2017/0249751 A1 | 8/2017 | Indelman | |
| 2017/0277951 A1 | 9/2017 | Axelsson et al. | |
| 2017/0329875 A1 | 11/2017 | Detwiler et al. | |
| 2017/0330032 A1 | 11/2017 | Du et al. | |
| 2018/0034879 A1 | 2/2018 | Chegini | |
| 2018/0174083 A1 * | 6/2018 | Farrell .................... | H04W 4/12 |
| 2018/0357062 A1 * | 12/2018 | Chichkov ................ | G06F 8/71 |
| 2020/0175623 A1 | 6/2020 | Howie | |

OTHER PUBLICATIONS

Xiao et al. â Reconstructing the Worldâs Museumsâ (Year: 2014).*

Sinha, Sudipta N., et al. "Interactive 3D architectural modeling from unordered photo collections." ACM Transactions on Graphics (TOG) 27.5 (2008): 1-10. (Year: 2008).

NPL Video Titled "Canvas: Create a 3D Model of Your Home in Minutes", Publsied by Occipital HQ on Nov. 10, 2016; https://www.youtube.com/watch?v=XA7FMoNAK9M; selection screenshots included. (Year: 2016).

Video Titled: "Interactive 3D Architectural Modeling from Unordered Photo Collections" by Maneesh Agrawala, Published Sep. 2009, available for viewing at : https://www.youtube.com/watch?v=RhNNLxHwz6s; select screenshots included (Year: 2009).

Agarwal, Sameer, et al. "Reconstructing rome." Computer 43.6 (2010): 40-47. (Year 2010).

\* cited by examiner

Platform

Integrations

*Yaw* (Y) is a counterclockwise rotation about the *z*-axis
*Pitch* (P) is a counterclockwise rotation about the *y*-axis
*Roll* (R) is a counterclockwise rotation about the *x*-axis

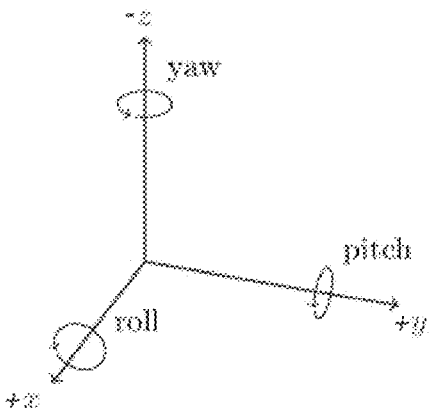

FIG. 20 Perspective View Rotations

The perspective view rotation matrix is given by:

$$
\begin{pmatrix}
\cos Y \cos P & \cos Y \sin P \sin R - \sin Y \cos R & \cos Y \sin P \cos R + \sin Y \sin R \\
\sin Y \cos P & \sin Y \sin P \sin R + \cos Y \cos R & \sin Y \sin P \cos R - \cos Y \sin R \\
-\sin P & \cos P \sin R & \cos P \cos R
\end{pmatrix}
$$

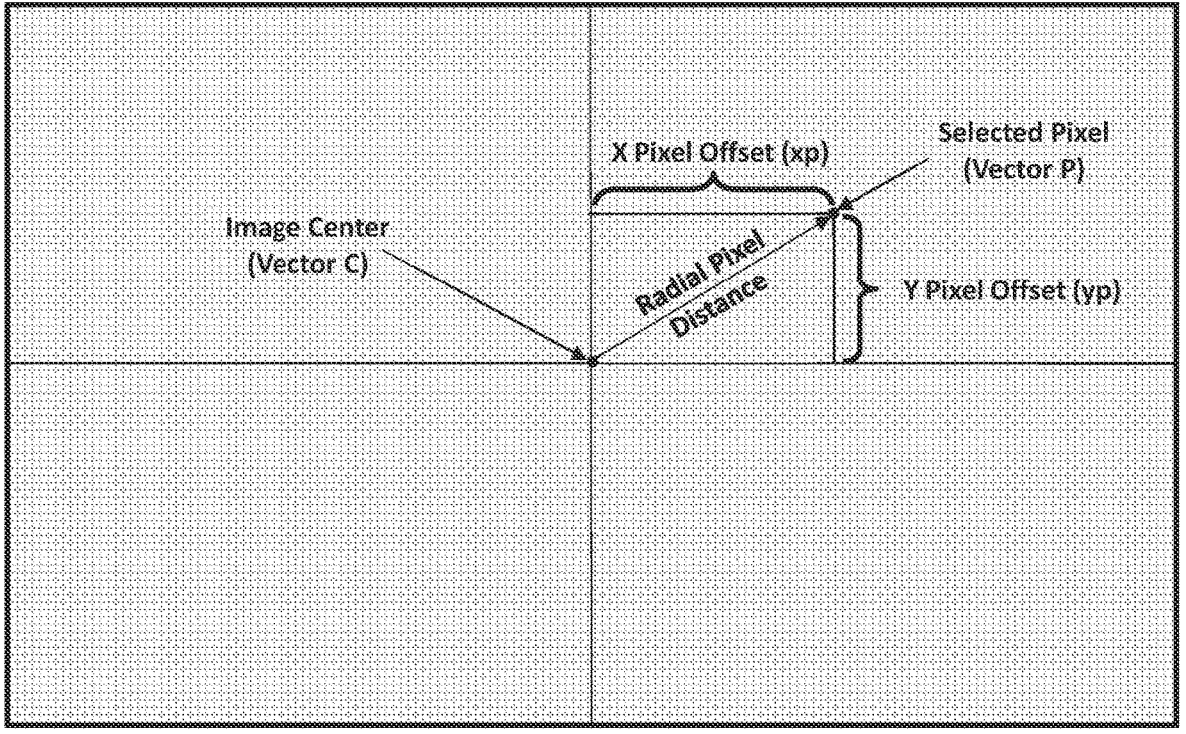
FIG. 21 Ray (Vector) to Pixel Mapping

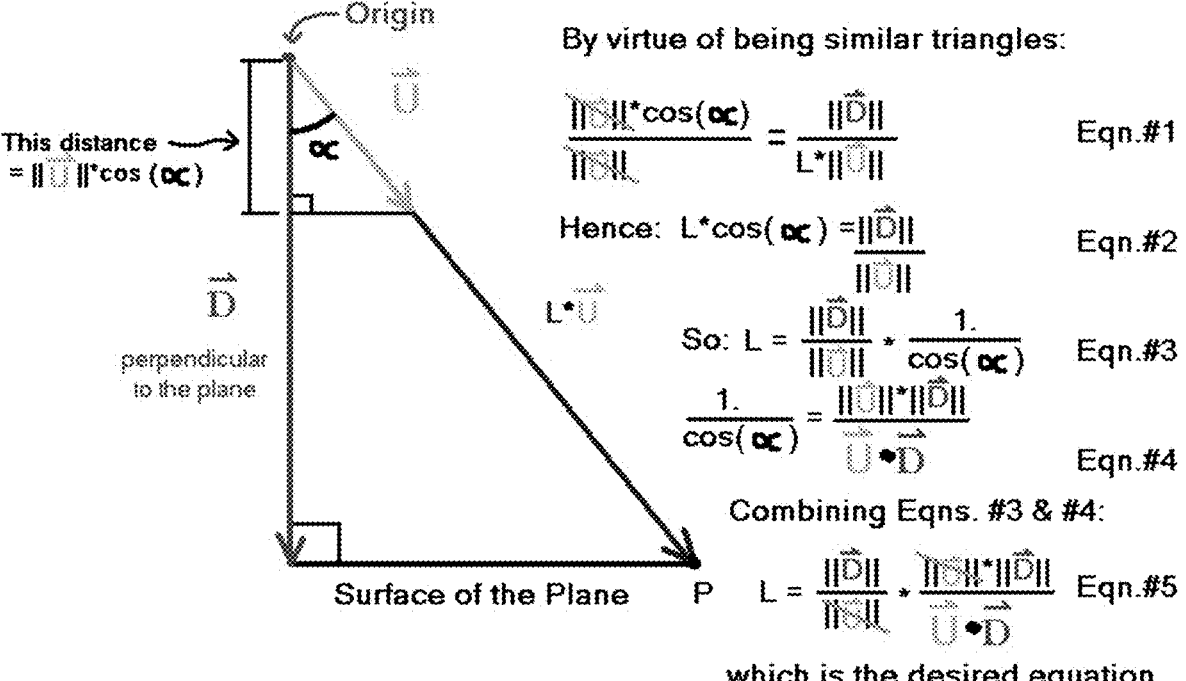
FIG. 22 Proof of "Ray-to-plane" formula

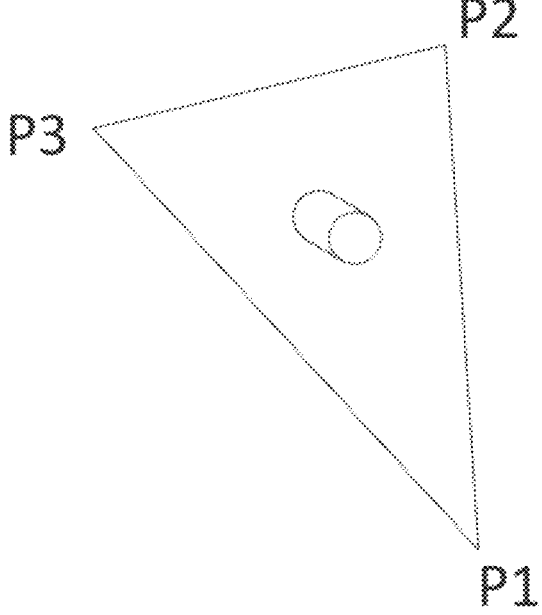
FIG. 23 Geometric plane defined by vectors

FIG. 24 shows a sketch created in natural oblique images with the Prespective Drafting Tool

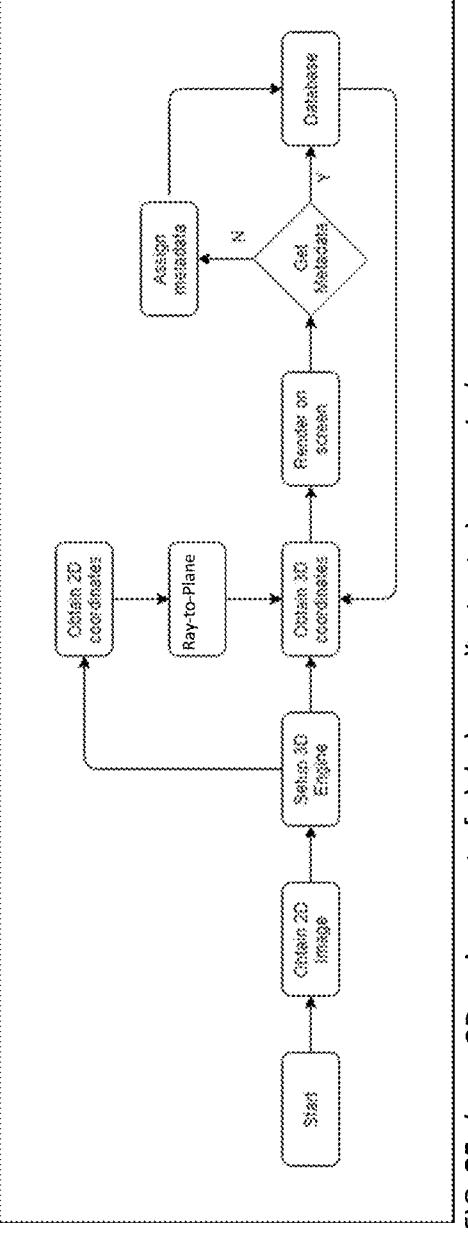
FIG. 25 shows 3D assignment of global coordinates to image pixels

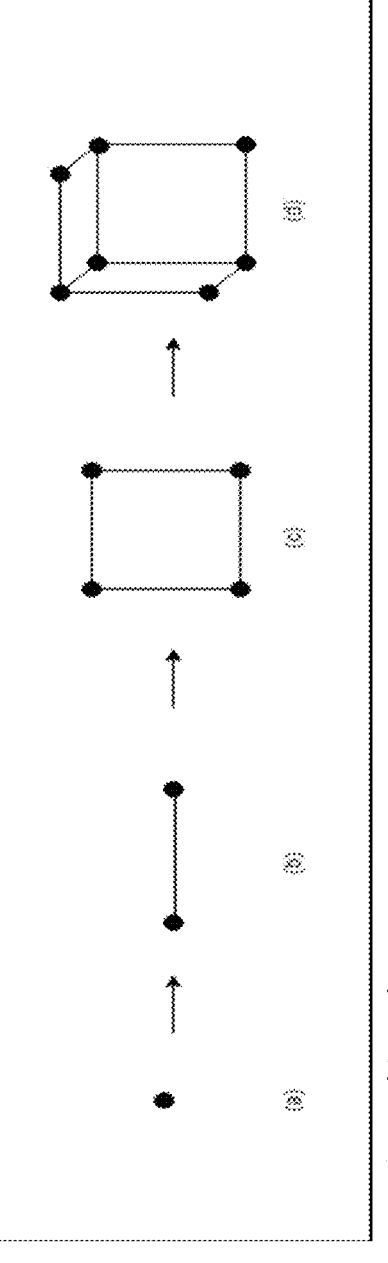
FIG. 26 3D Object Elements

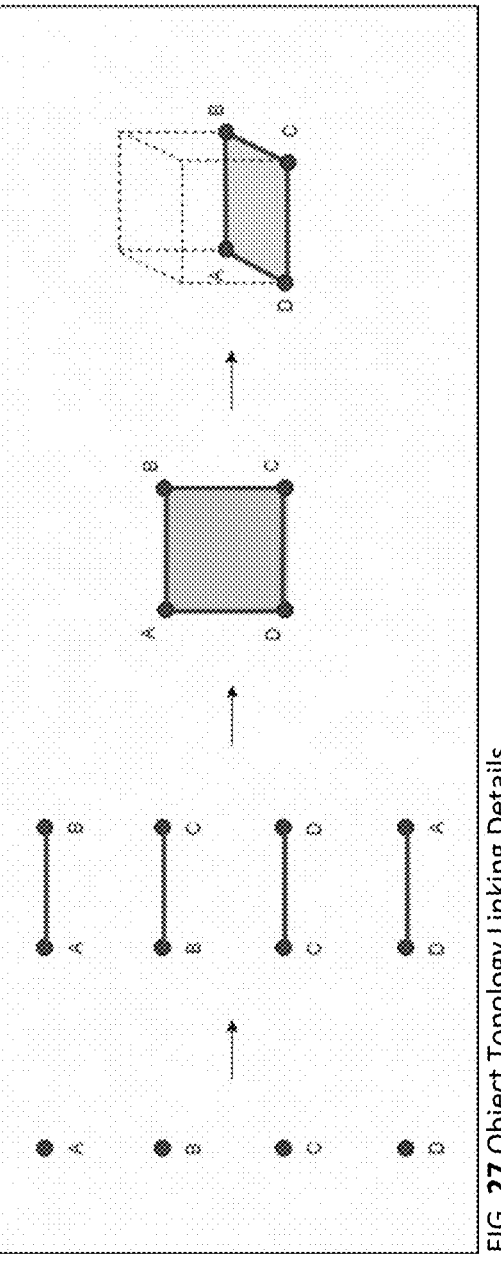
FIG. 27 Object Topology Linking Details

SHARED GEOGRAPHIC INFORMATION SYSTEM FOR CREATION, CHANGE MANAGEMENT AND DELIVERY OF 3D STRUCTURE MODELS

CROSS-REFERENCE TO RELATED APPLICATION(S)

This application claims the benefit of U.S. Provisional Application No. 62/783,803 filed Dec. 21, 2018 for "3D COMMUNITY GIS SYSTEM WITH INTEGRATED PROJECT MANAGER AND REVISION CONTROL", which is incorporated by reference in its entirety.

This application is related to application Ser. No. 16/725,310, filed on Dec. 23, 2019 and entitled "GEOGRAPHIC INFORMATION SYSTEM FOR CREATING 3D STRUCTURE MODELS USING PERSPECTIVE VIEW DRAFTING".

BACKGROUND

Equality of taxation for man-made structures is a difficult task due to ongoing additions and structure modifications made by property owners. Likewise, insurance companies may be unaware of new structures and structural changes that cause insurance premiums to be inaccurate. First Responders suffer from a lack of up-to-date interior layout of large public and commercial buildings.

Traditionally, local assessors attempted to visit each property on a periodic basis to inventory the size and quality of man-made structures to place a value on the property. This has become increasingly difficult for a variety of reasons including a strong abhorrence of property owners to allow assessors on their property.

Increasingly, aerial imagery has helped local assessors to improve property tax equalization but the task to create an accurate baseline of structure information is beyond the capability of most taxing jurisdictions and likely the reason there is no national repository of such information. Even if all the tax information were in a community system, the currency and accuracy of the information would be questionable without addressing the broad range of requirements of taxing authorities, insurance companies, and first responders fulfilled by the invention.

SUMMARY

A new generation 3D modeling system is described for the management of the 3D characteristics of man-made structures in a shared geographic information system (GIS) platform. The system accommodates the conversion of 2D GIS topology to 3D real-world topology, originate and perpetually maintain 3D models and non-graphical attribute data managed by a community of users based on a series of permissions and user roles. The system integrates 3D model data with attribute data and may be supplemented with published map or attribute data and/or data made available by users of the system. The system provides scalable management tools configurable to any size project using dynamic combinations of jobs and tasks within projects. The invention dynamically generates work assignments based on but not limited to account weights, worker production profiles, worker availability, and instant project priorities. The community platform allows work to be assigned to multiple organizations with multiple workers providing real-time scaling of resources. Worker performance is captured and used for management of a productivity rating system. A Revision Control module manages user work as it passes through production by storing and cataloging revisions until the work is approved for final publishing thus creating a new dated version of the work for distribution. The system supports a mobile platform application that provides much of the key functionality of the primary application including a perspective based sketching tool that may be used inside buildings. The field application is fully integrated with the primary system making real-time updates from the field to the master database in the primary system. Change Management of real estate infrastructure, real-time camera feeds showing the inside and outside of structures, static photos or archived video showing the inside and outside of structures, and real-time tracking of 3D position inside buildings make the invention a critical advancement for building security and critical response situations.

The system is scalable to manage any size 3D GIS project for user groups such as but not limited to insurance organizations, real estate organizations, municipalities, townships, counties, state organizations, taxing jurisdictions, and utility companies. Examples of applications may include but not limited to insurance claims and underwriting, tax equalization, emergency response, economic development, engineering, building and construction, utility infrastructure, planning and zoning, public works and transportation, telecommunications and the like.

The system is project driven which includes but is not limited to participants such as; "accounts" defined as companies or departments and "users" such as project managers, workers, system administrators, partners and the like.

GIS projects are created and managed by project managers within the Community.

Projects consist of job types and job tasks relevant to GIS work both of which are definable by the account project manager. Job tasks define the work to be completed but also define any qualifications or requirements a worker must have to work on the task.

Community account managers define user permissions to access features and datasets as well as worker availability relative to projects. Workers may be made available for projects outside their account thus creating a community of workers available to any project manager in the Community thus projects are scalable and can be completed on time.

The system uses an automated work assignment system to match workers to project tasks. From a dashboard, a worker tells the system they are ready for work, the work assignment module gathers data from the User Productivity system, Project Management system, User Security and Permissions system and using machine intelligence determines the next work assignment (task) for a worker. When the worker completes the current work, the worker makes another work request to the system, and the system issues the next work assignment for the worker.

A revision control system catalogs all saved work by workers for revision control purposes. When a revision is approved for publishing by a worker with correct permissions, the system assigns a version number to the published work. Revisions are copies of a work as it passes through production tasks for purposes of restoring or generating a works life cycle history. Revision control applies to 3D GIS geometric and attribute data.

The system uses a change management system to catalog data changes from any of the databases within the system that have published work. The system records but is not limited to; change date, change type, data type, worker ID, database ID, change notes (why was change made), and the new data values.

A communications and notification system monitors the change log for purposes of sending change notifications to subscribers. Subscribers are notified of changes based on the subscriber's notification preferences.

A mobile platform application provides a perspective based sketching tool allowing users to take their work into the field, capture imagery with a built in 3D camera for creating 3D photogrammetric models and measurements, create and/or edit any GIS or non-graphical data and synchronize those updates with the primary system. The synchronization is done in real-time so that another user could be observing and quality checking the work of the field agent and suggesting changes or the collection of other data before the field agent leaves the site. The mobile platform supports a laser distance meter and/or 3D camera for capturing measurements in the field. The 3D camera for capturing video or multiple stereo perspective view images is sufficiently accurate to create stereo photogrammetric digital surface models for use in creating 3D models.

The system incorporates a library of application programing interfaces (APIs) to facilitate the exchange of GIS data and non-graphical data between the invention and 3rd party applications allowing workers who have approved credentials to access the system for extended capabilities. Security profiles are established for each partner which the Authentication process uses to approve access to and authenticate the data request from the 3rd party application.

BRIEF DESCRIPTION OF THE DRAWINGS

FIG. 3 shows detail of an Account module of the illustrated system and method in

FIG. 2.

FIG. 20 Shows perspective view rotations.

FIG. 21 shows ray (vector) to pixel mapping.

FIG. 22 shows proof for the "Ray-to-plane" formula.

FIG. 23 shows a geometric plane defined by vectors.

FIG. 24 shows a sketch created in natural oblique images with the 3D Perspective Drafting Tool.

FIG. 25 shows detail of the assignment of global coordinates to image pixels.

FIG. 26 shows detail of the hierarchy of elements that create a 3D object.

FIG. 27 shows object topology linking details of the illustrated system and method in FIG. 2.

DETAILED DESCRIPTION

Figure 1:
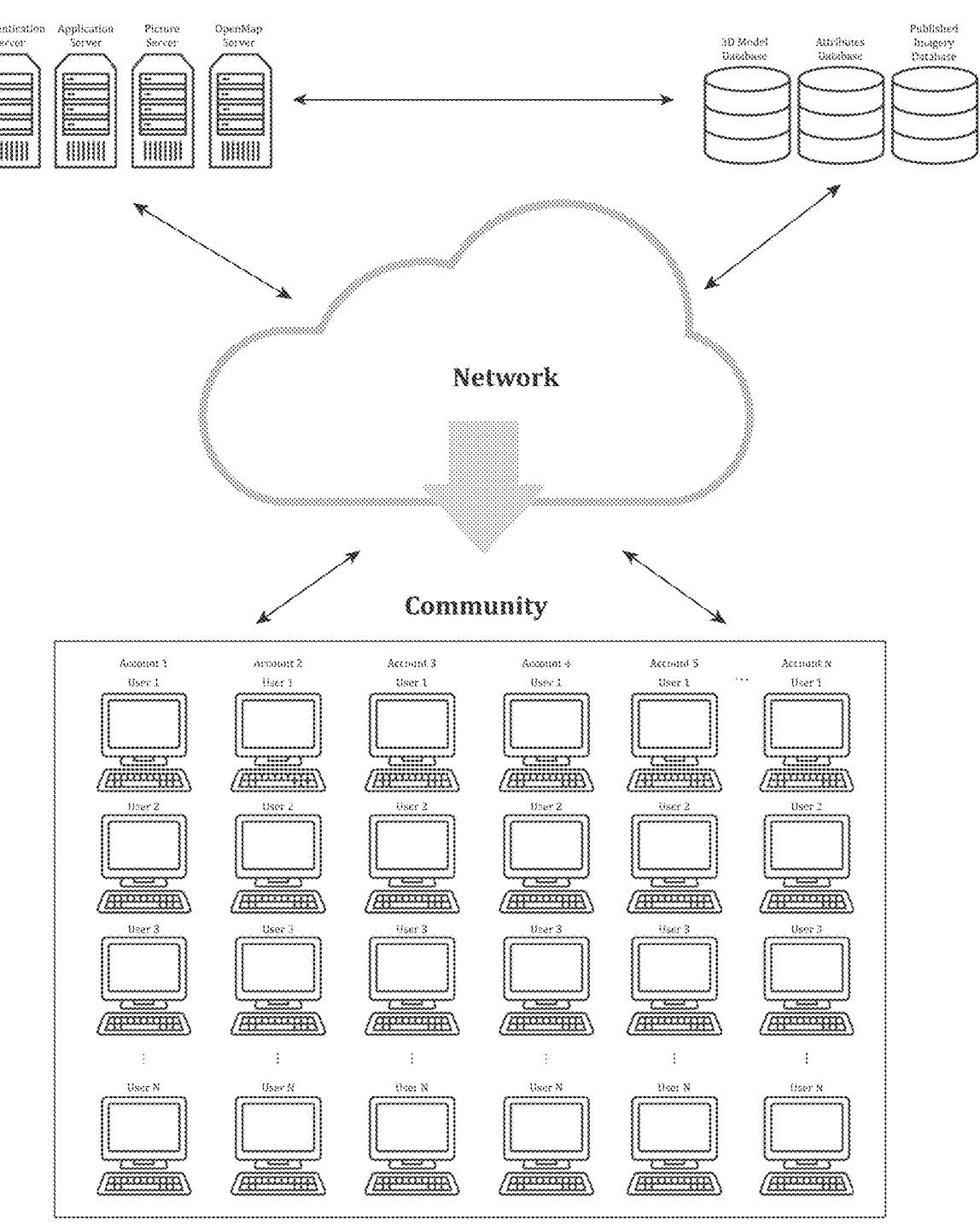
FIG. 1 is an illustration of a system and method for project and change management of 3D Graphical Information System (GIS) projects.

What is needed is a scalable community GIS system with access to an established repository of certified or quality graded structure sketches that are linked to the tax records with valuation of each structure. Such a system is disclosed herein which converts existing 2D sketches to 3D and includes automated 3D sketches created from periodic stereo or non-stereo images and/or LiDAR; an efficient 3D perspective sketching tool to create or modify the 3D sketches using spatially accurate oblique imagery; revision control and versioning of the 3D sketches through time; an automated work assignment system with an integrated project management component to support an interconnected worker community; and a change management component that identifies man-made structure changes within any geographic area by value of change for any time period. The 3D GIS community relies on frequent imagery updates with ongoing change detection and validation provided to and/or by the community of participants.

The invention relates to methods and systems for the project management and change management of 3D GIS data. Particularly, for the creation and perpetual management of 3D map production in real-world coordinates of both man-made structures and non-man-made objects and associated attribute data; for the automated assignment of project job tasks to workers based on a productivity model with individual worker ratings by the job task type. All work is augmented by a revision control system that catalogs every saved work entity in production and when a work entity is approved for publishing it is versioned automatically then published by the system.

At the time of the invention there was no known 3D GIS with built-in revision control, automated work assignments, and dynamic project management supporting a community of participants. Nor was there an automated 3D GIS structure change management system available.

Change management of taxable structures will not be effective and taxpayer equalization objectives will not be met, insurance companies will continue to insure property without accurate information, and First Responders will not have immediate access to current interior layouts of public and commercial buildings without the new invention. The additional risk for insurance companies results in higher insurance premiums for everyone. For First Responders, not knowing the current layout of a building including layout and building exits may potentially put human life at risk. A need exists for new tools to manage GIS projects.

Current GIS systems do not manage changes to GIS data but rather attempt to keep the information current. Companies today are forced to use non-GIS specific project management tools and in most cases the need for multiple tools is prevalent which creates additional manual effort to manage a GIS project. The lack of an established baseline of accurate information with continuous maintenance results in lost confidence of the data. A glaring deficiency also exists due to the lack of revision and versioning controls in GIS systems. Without revision controls integrated into the project management system, there is no effective way to compare changes made between any two points in time. The lack of integrated revision control and versioning of GIS data makes it impossible to "look back" at historical data to see when a structure was added to the records.

GIS projects by nature are time consuming and can require substantial resources. Project priority changes, production interruptions, customer requirement changes may all leavea project manager helpless without GIS project management tools. The invention not only manages tasks, milestones and traditional project data, but it uniquely automates the assignment of job tasks to the workers based on worker profile information such as but not limited to: qualifications, permissions and availability.

GIS project work requires varying skill levels. Current solutions do not provide the tracking of worker performance and accuracy based on completed tasks specific to GIS project functions. The invention tracks each worker's production accuracy for purposes of measuring performance which is translated into a rating scale for each worker specific to each task type within the GIS project management system. The rating scale is used for but not limited to auto-assigning of work to the right skilled workers, determining the amount of resources needed for a given project, or for identifying when additional training may be needed for workers.

Currently, taxing jurisdictions create structure sketches in simple 2D orthogonal sketching systems. The sketches created often contain errors because the measurements made are either incorrect or transferred to the sketch incorrectly. The 3D Community GIS System converts these 2D sketches to 3D mappable sketches in real-world coordinates. The 3D sketches are then modified as required with new field measurements or by correcting the sketch to fit non-stereo oblique images. Other existing 3D models such as digital surface models created from photogrammetric or LiDAR point clouds may also be used to create or edit 3D sketches from any view of the model.

Most web-based GIS systems only allow for the viewing of map data and very few even provide the ability to edit or create 2D maps and data layers. The invention describes a web-based 3D GIS system with fully integrated perspective drafting tools, automated worker assignments, and revision control to provide change management for a community of participants.

Referring to the illustrations wherein similar descriptive labels may designate identical or corresponding parts throughout the multiple figures, FIG. 1 is an illustration showing a system and method for project and change management of 3D Graphical Information System (GIS) projects. In FIG. 1, the illustrated system and method includes application servers, authentication server, imagery servers and map servers that access information in a database. A network (e.g. wired or wireless) connects subscribers to the application server which retrieves data from the servers for display or editing purposes by the user. The illustration depicts a community of users that access the system via the web-based application for purposes of managing GIS related projects or viewing GIS map and attribute data.

The current invention uses Microsoft ASP.NET 4.0, Microsoft SQL Server 2012, Internet Information Services (IIS) 7.0, jQuery 2.0.0, JavaScript, hypertext markup language (HTML), Open Map Server, PostGIS, PostgreSQL, ReACT, C++, and C#. One skilled in the art of software system development will recognize that the invention may use a variety of different frameworks, languages and databases as future requirements demand.

Figure 2:
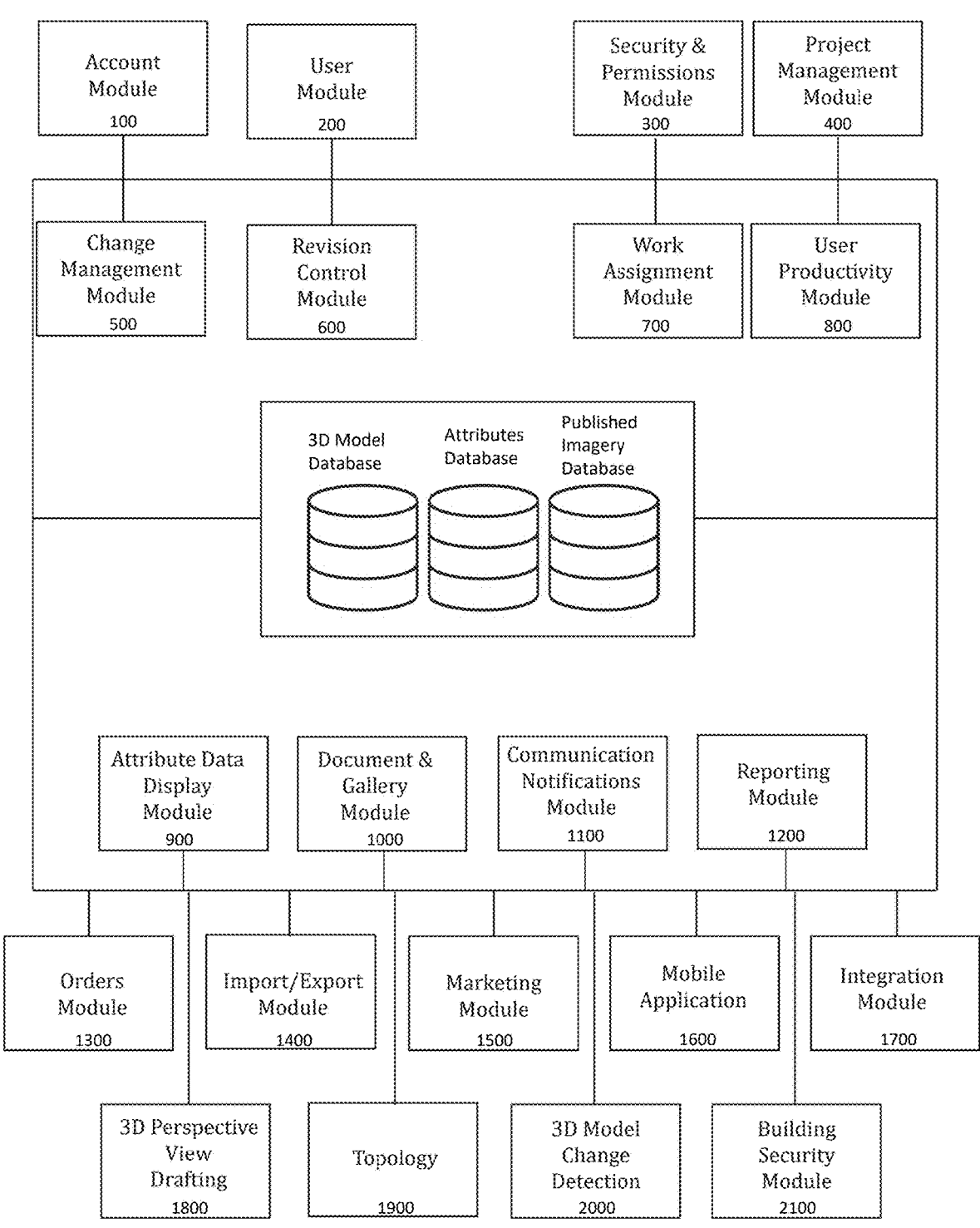
FIG. 2 shows detail of subsystems within the system and method illustrated in FIG. 1.

FIG. 2 shows further detail of the sub-systems within the system and method illustrated in FIG. 1 The sub-systems are fully integrated making their specific functions executable from any section within the Community system.

Figure 3:
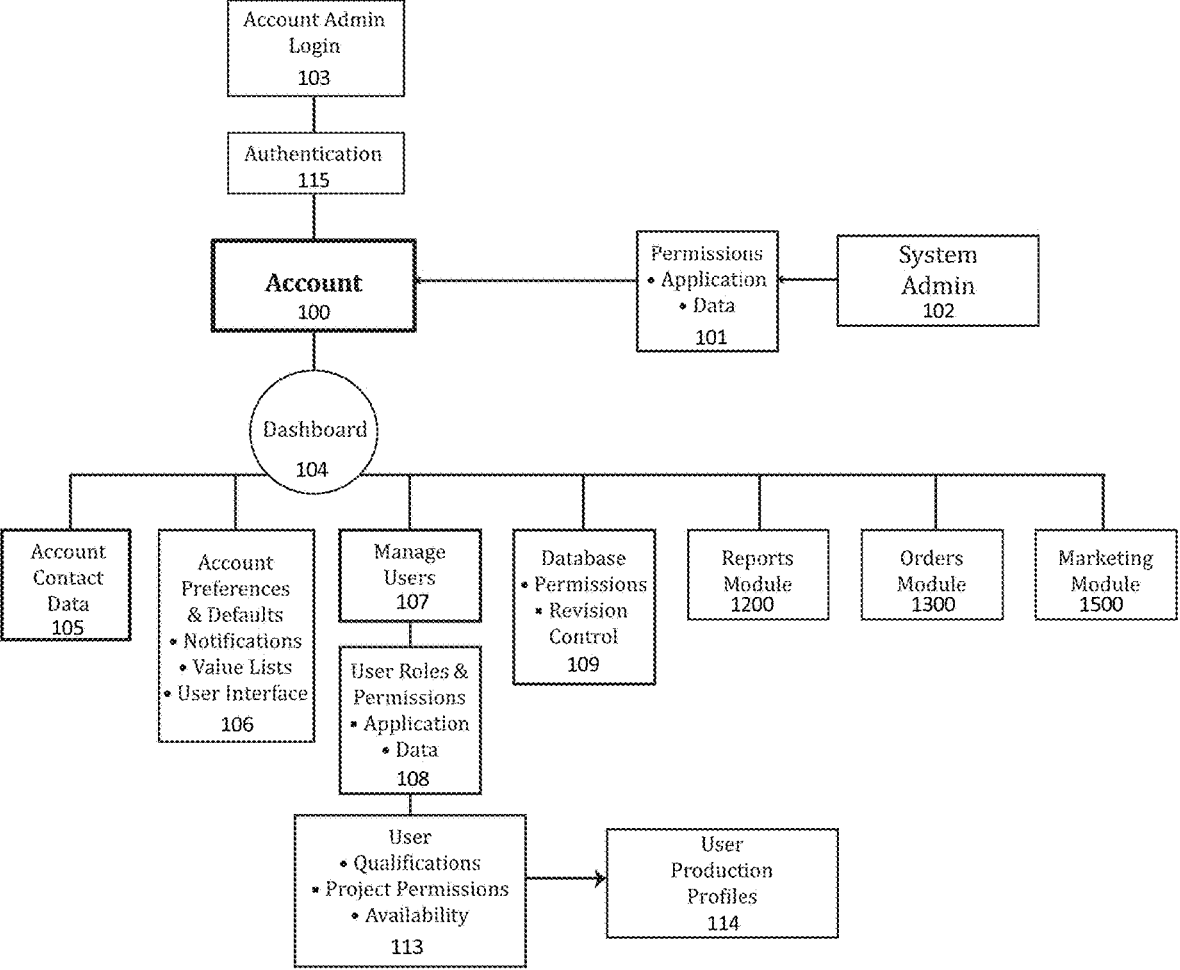

FIG. 3 shows further detail of an Account module of the illustrated system and method in FIG. 2. In FIG. 3 an Account Module 100 allows an account administrator to log into the system 103 and then be authenticated 115 to gain access to the account dashboard 104. From the dashboard the account administrator 102 may manage account contact information 105, manage account preferences and defaults 106 such as what and how often they wish to receive notifications, manage data value lists and customize the view within the application. The account administrator manages the account database(s) 109 including permissions and revision control configurations. Account administrators manage users 107 within the account, their permissions and access to application modules, databases 108 and project job task qualifications, project permissions and availability 113 which generates a user production profile 114. The account administrator has access to the report module 1200, the orders module 1300, and the marketing module 112. The reports module 1200 supports the configuring and printing reports such as but not limited to; user productivity reports, change log reports, project summary and detail reports. The orders module 1300 provides a complete order history for the account including reporting and exporting of order details. The marketing module 1500 provides tools for generating marketing prospecting lists based on map data and attribute data available to the account.

Figure 4:
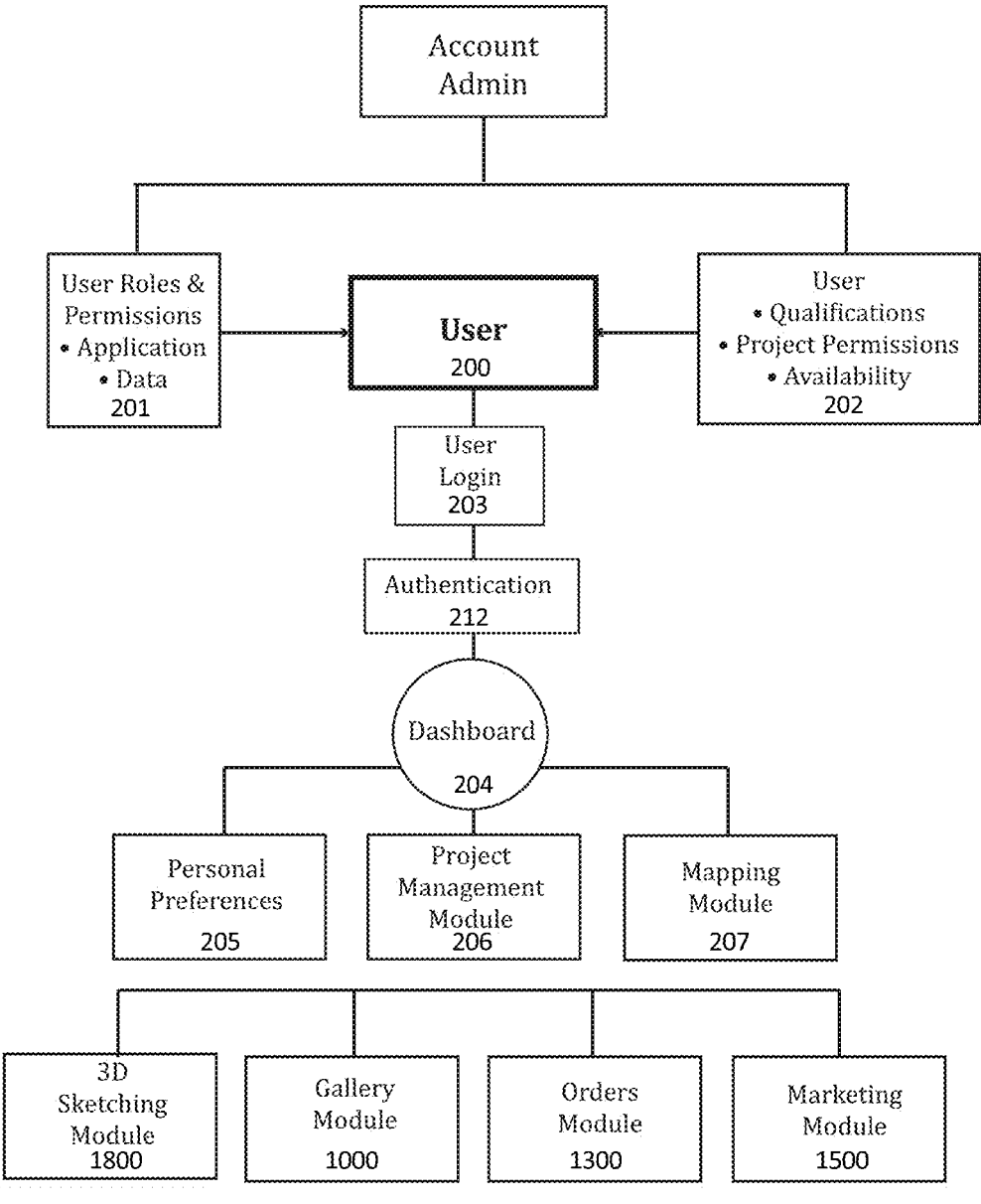
FIG. 4 shows detail of a User module of the illustrated system and method in FIG. 2.

FIG. 4 shows further detail of a User module of the illustrated system and method in FIG. 2. In FIG. 4 a User Module 200 allows a user to log into the system 203 and then be authenticated 212 to gain access to the user dashboard 204. From the dashboard the user has access to application modules approved by the account administrator including but not limited to personal preferences 205, the project management module 400, the change management module 500, the 3D sketching module 1800, the gallery module 1000, the orders module 1300, and the marketing module 1500. The user manages their personal preferences for user interface, notification settings, contact information and personal calendar. The project management module view for the user is driven by the project permissions set by their account administrator and their production profile. They only see project jobs on their dashboard where they meet all the criteria to work on a job.

Figure 5:
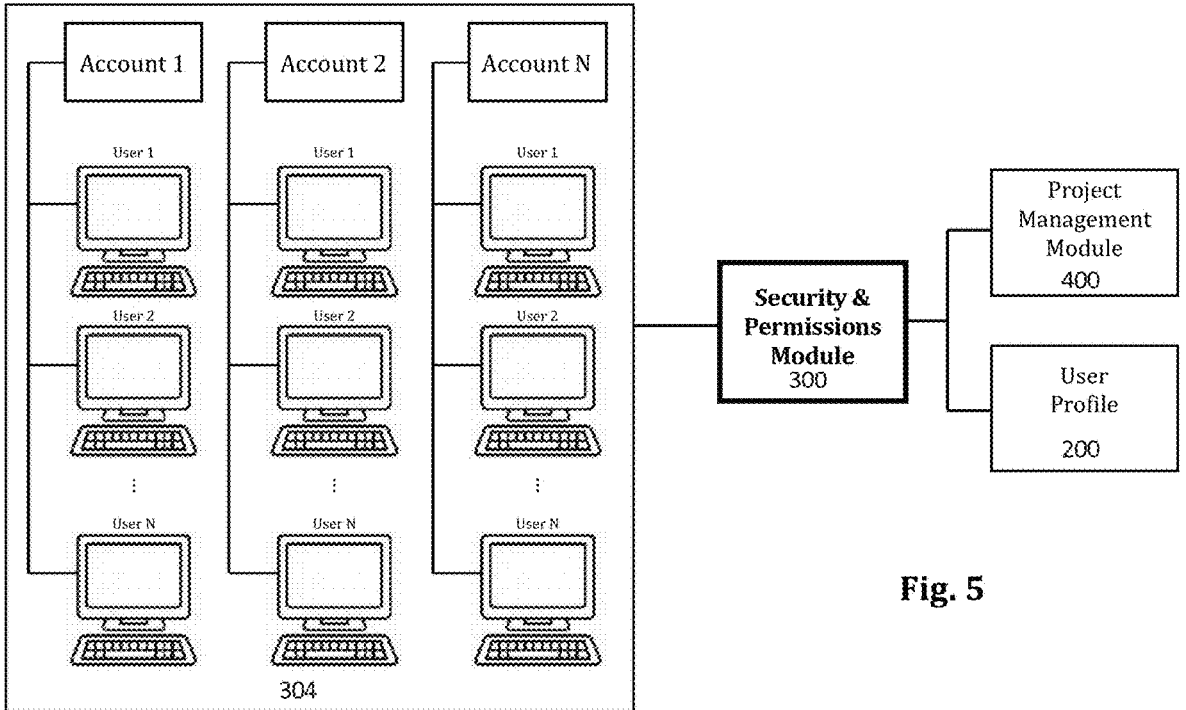
FIG. 5 shows detail of a Security & Permissions module of the illustrated system and method in FIG. 2.

FIG. 5 shows further detail of a Security & Permissions module 300 of the illustrated system and method in FIG. 2. The security and permissions module 300 is the final disseminator of access to applications modules, functionality within a module and database access for both the account administrators and users. The security and permissions module 300 collects input from both the project management module 400 and user profiles (user module 200). Together these datasets tell the security and permissions module what sub-systems anddata a user may access within the system.

Figure 6:
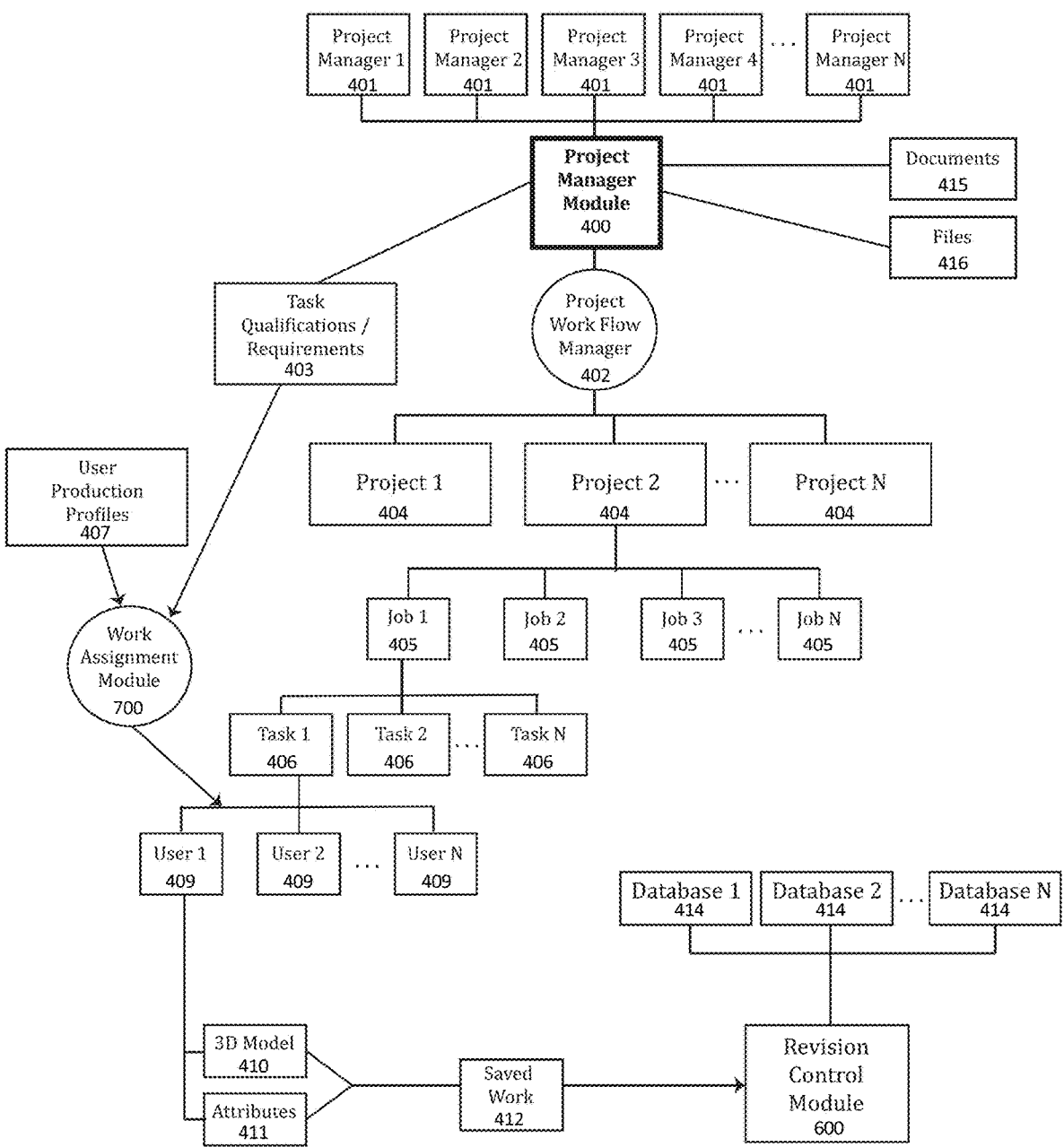
FIG. 6 shows detail of a Project Management module of the illustrated system and method in FIG. 2.

FIG. 6 shows further detail of a GIS Project Management module of the illustrated system and method in FIG. 2. The project management module (PMM) 400 supports the creating and administrating 3D GIS management projects. The PMM features but is not limited to: management of GIS map layers (e.g. man-made structure wireframes, facets and the like) and attribute data (e.g. structure square footage, structure type, number of facets, dimensions, description, structure materials, and the like). Project information is stored in a database to include but not be limited to project title, project description, project job information, project job task information, project statuses, project type, beginning date, expected due data and completed by date, accounts and users assigned to a project.

A GIS project is started by a project manager 401. The project manager provides all details for project setup which include but are not limited to geographic area, description, project type, who is the project for (e.g. customer or internal), start date, expected completion date, accounts and users assigned to perform work on a project and then job task qualifications and requirements 403 to define the type of worker that may work on the job task(s). A project 404 is defined by jobs 405 then by job tasks 406. The project work flow manager 402 manages the project based on priority set by project manager and available resources. As job tasks are opened to the system, the work assignment module 700, gathers data input from the task qualification/requirements 403 and the user production profiles 407 and determines what workers may work on the specific job tasks until completed. As workers are assigned toprojects, they are automatically notified per their notification preferences of the job assignment or when auto-assigned when they request work from the system. Workers also see the new assignment displayed on the dashboard display. As data 410/411 progresses through production and when workers save their completed work 412 it is cataloged by the revision control module 600 which then saves the revision to the database 414. Job tasks include but not be limited to: a begin date, due date, task description and task status. As each job task is completed the system records date/time stamp/userID and new status, the system auto-assigns the work to the next job task type defined in the project setup. The worker then makes a request via the Work Assignment Module 700 which starts the process over again. If project criteria (e.g. job priorities, project status, delivery date, and the like) are modified by the project manager 401 at the project level the project work flow manager 402 receives those updates which allows a project to remain dynamic from beginning to end.

The PMM 400 provides an online document repository 415 and files repository 416 for project supplements (e.g. specifications or requirements documents, graphics, project meeting minutes and the like).

The PMM 400 provides a system for tracking of all user activity via the User Productivity Module 800 including but not limited to; user tracking reporting, task level quality assurance reviews with reassignments if needed or approval for next action.

The PMM 400 also supports partner relationships whereby a 3rd party user account is created for an outside account with users to access the system to perform work and/or manage any tasks that have been assigned to them through the PMM. Permissions would limit the partner user to only access job tasks assigned to them with no access to any other functionality within the system.

The PPM 400 also supports both internal and external communications. Notifications are managed through individual user preferences to control what they want to be notified about and the method they wish to be notified. Support is available to users via online Chat session, email, online knowledge base, and phone.

Predefined list options exist related to specific job tasks to control standards but may be modified and customized by the account administrator or project manager within the system. Project templates may be created for projects that have repetitive tasks used frequently to also streamline the creation of new projects. Projects and job tasks may be cloned to streamline the creation of new projects and new tasks.

A worker rating system records the proficiency of users for every task type they perform. The worker's performance rating moves up or down based on the number of tasks that are re-assigned or reworked. This allows a project manager to determine whether a workerneeds additional training to improve his/her productivity. It also allows the system to properly predict the estimated completion of the project based on the experience rating of the dynamic workforce. The project manager sets the minimum task rating level for workers allowed to be assigned a task. When the Work Assignment Module 700 goes to auto-assign the next task to a user 409 it is this proficiency rating that is used to determine what tasks the worker may be assigned.

An example 3D GIS project may be a property information management project that consists of selecting a geographical area of interest such as the City of Minneapolis and creating footprint wireframes for that area. Job 1 may be related to the capturing of aerial imagery (e.g. Ortho and Oblique). Job 1 tasks may be broken down into individual flight lines required to collect the project geographical area. Job 2 may be related to the processing of the aerial imagery for viewing purposes. Job 2 tasks may be broken down into sub-sets of the collected imagery for processing as well as signifying the minimum proficiency rating a worker must have to be assigned to these tasks. Job 3 may be related to quality assurance and clean-up of the imagery for viewing purposes. Job 3 tasks may be broken down into geographical sub-sets for processing as well as signifying the minimum proficiency rating a worker must have to be assigned to these tasks. Job 4 may be related to customer approval of the imagery. Job 4 tasks may be broken down using the same geographical sub-areas in Job 3. Job 5 may be related to the final publishing of the imagery for user viewing. Job 5 tasks may use the same geographical sub-sets as Job 4.

A user with Admin rights creates a project (project manager) with the necessary jobs and job tasks to accomplish the project requirements. The project manager sets up all the project variables (e.g. jobs and job tasks) and identify what account and users to assign to the project. The production workers receive a notification based on their notification preferences that they have been assigned to a new job. When the worker logs into the system and is authenticated they are taken to their dashboard where they see a listing of jobs they have been assigned to. The user makes a request to the system for a job task to work on and the system makes the work assignment.

In our example, a worker might be qualified to work on job tasks related to the development of footprint wireframes of structures. The system would assign a parcel to the worker with the task of creating wireframes for all the structures in the parcel. As the user completes the footprints for a parcel, the system upgrades the status and the system assigns the parcel to the next available production worker, in our example it would go to a Quality Control person. This process continues until all footprints have been completed and approved.

Figure 7:
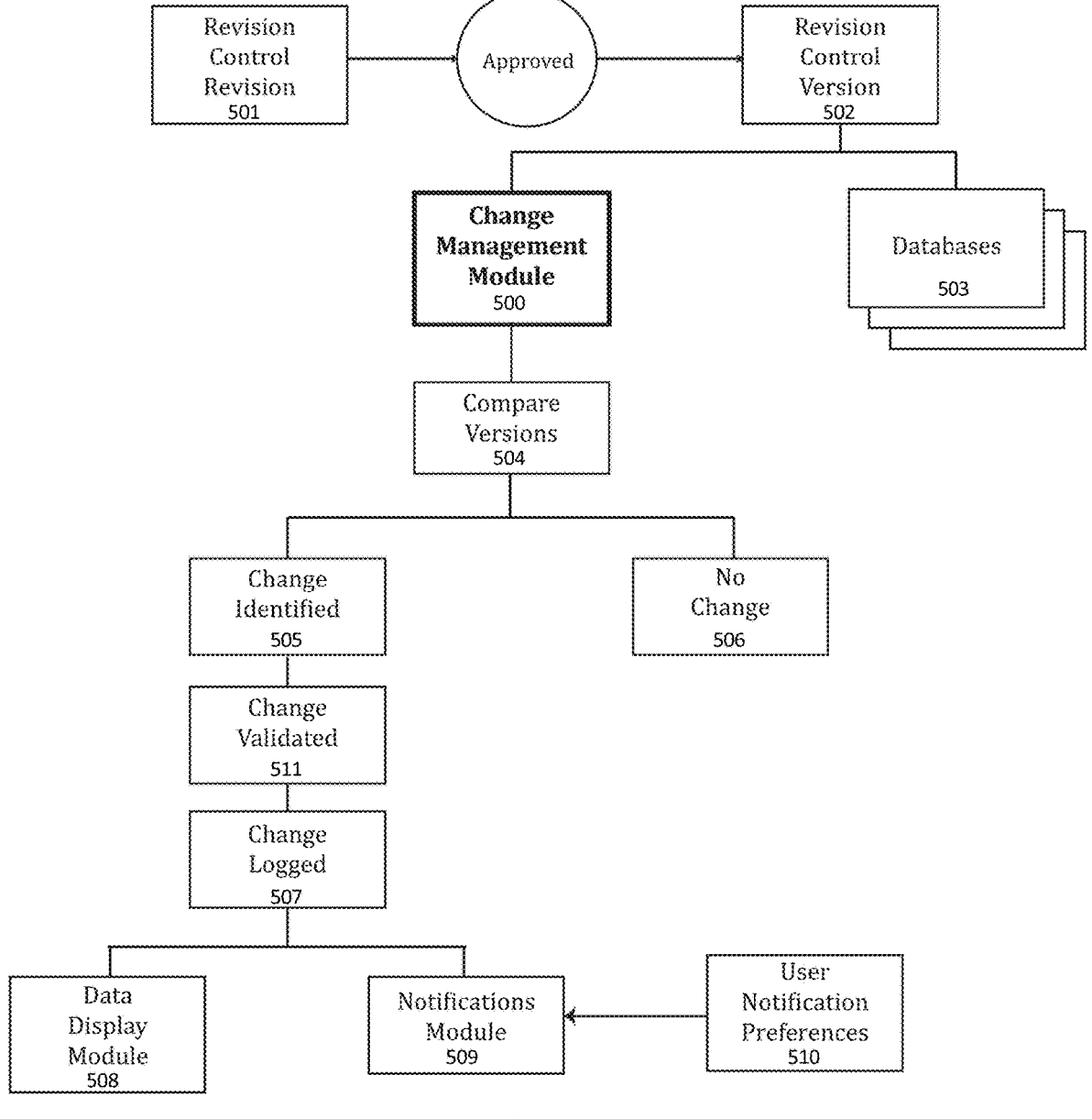
FIG. 7 shows detail of a Change Management module of the illustrated system and method in FIG. 2.

FIG. 7 shows further detail of a Change Management module 500 of the illustrated system and method in FIG. 2. At the core is a system to manage changes to data used in 3D GIS projects, data to include but not be limited to GIS map data and attribute data. In the invention, change management is a method for managing and recording changes that have taken place to man-made structures (e.g. residential or commercial structures, power poles, power lines, road signs, roadways, bridges, underground infrastructure) and structure attribute data such as but not limited to; square footage, dimensions, number of facets and the like, then making those changes available to a "community" of subscribers. Change detection is a component of change management and may be accomplished by but not limited to image recognition processes, comparing structure outlines (wireframes) to measure edges, area or volume, or by manually viewing imagery to locate changes visible in that imagery. The system uses a combination of machine tools to automate the creation of building outlines (wireframes) which are then compared to the previous version of the wireframe 504 then supplemented by manually validating 511 the newly created wireframe within aerial imagery and when available certified by the local authority of the data. The system is proactive in that it notifies subscribers of those changes based on a set of parameters defined by the user as to how and when (frequency) they wish to be notified. The Community of users, depending on permissions, may contribute to the ongoing management of the core public library of published data which is shared with the Community or be limited to their own. Users may also make their own revisions of data from a copy of data from the core library and save it to their own working space.

The data may include but is not limited to: aerial photography, structure attribute data, structure map data (e.g. vector, raster images), supplemental graphics and the like. The Change Management module is responsible for identifying changes 505 by comparing versions of data within a database 503, a current version to the latest version 504 and when a change is validated 511 it is cataloged 507 and the data is stored on a server with a change type, date/time stamp/, userID, data sourceID, and status, then the change is communicated to subscribers through the system dashboard 508 or through electronic email 509 per a user's notification preferences 510.

The system identifies, validates, catalogs and communicates changes to GIS data elements automatically, human intervention is not required to fulfill a change management process but may be implemented as an optional step in the GIS project management system. The change management module 500 is fully integrated with the project management module 400 so when a worker's finished work (e.g. updated from revision to version) has been published a trigger event from the project management system 400 notifies the change management system 500 of a new published work. The change management system then enacts the method described herein to complete the change management process.

Change Management within the Community application is accomplished using machine automation tools and as an option, human inclusion as part of the process.

Continuing with our previous example for a property information project, potential data changes may be related to but not limited to; aerial imagery, (e.g. each new flight becomes a new data which not match a previous data), structure footprint wireframes and their associated attribute data such as material type and quality, structure construction type, structure descriptors and structure classification structure dimensions, structure square footage, structure valuation, number of structures within a parcel, and system generated estimated values for structures based on but not limited to classification, square feet or volume, and graded quality. Beginning with access to the local authority's actual recorded information attributes, the Revision Control Module stores the revision and version together with the original data and subsequent data changes in the 3D Model and Attribute databases. The Change Management module automatically classifies the change status based on its importance for the local authority for review and approval.

Figure 8:
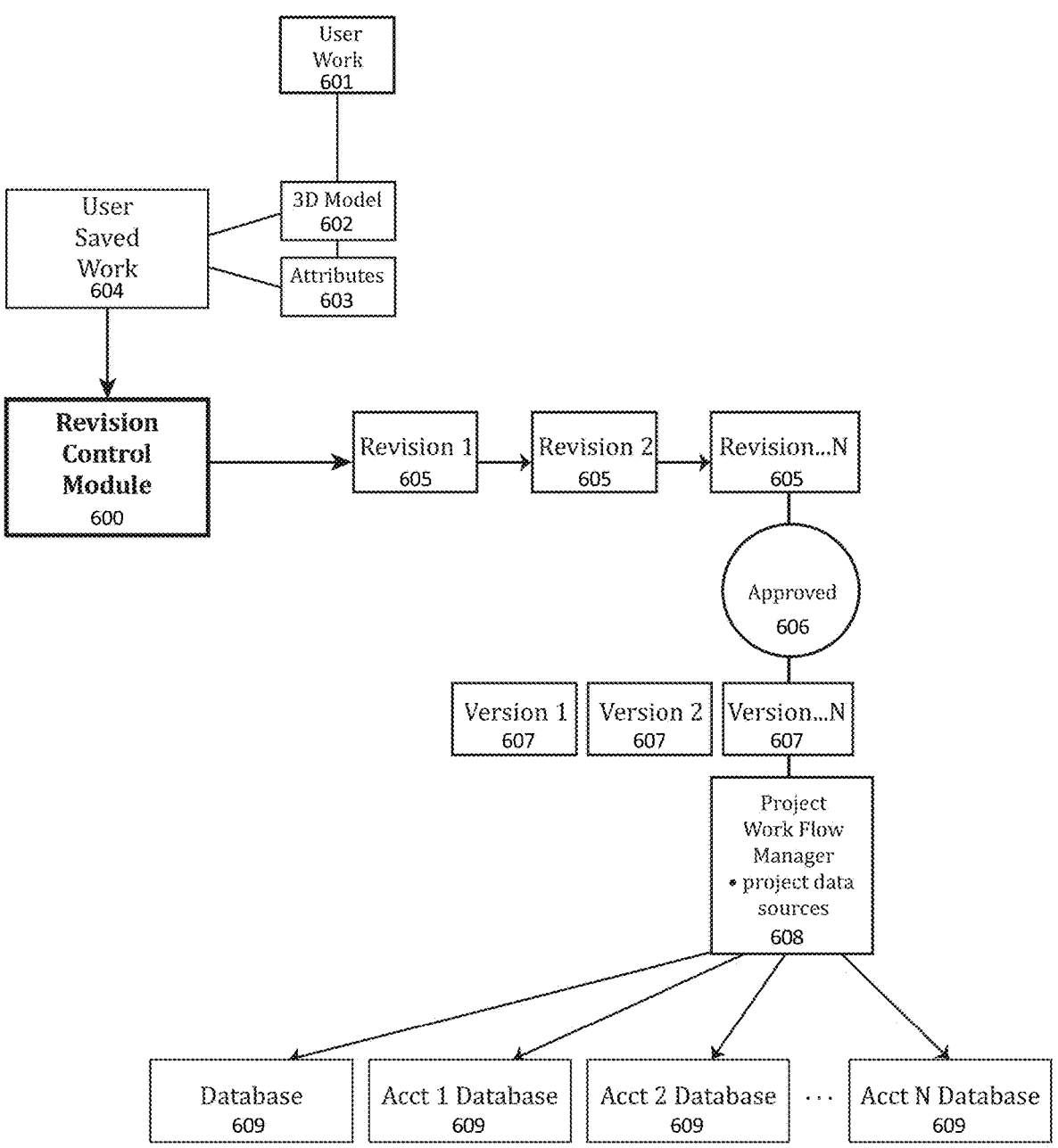
FIG. 8 shows detail of a Revision Control module of the illustrated system and method in FIG. 2.

FIG. 8 shows further detail of a Revision Control module 600_of the illustrated system and method in FIG. 2. The very nature of GIS projects has workers potentially making several revisions to GIS data and particularly to structure outlines. The GIS project management module is fully integrated with the revision control module to manage the versioning of work completed. As a worker is auto-assigned work 601, the worker completes and save the work 604. The types of work include but not be limited to 3D models 602 and/or data attributes 603 of structures. The saved work triggers the revision control module 600 to catalog and save a revision control record of each revision of work 605. The revision control record contains but is not be limited to; a Unique Key, UserID, date/time stamp, and Revision #(sequential numbering system that increments by 1 for each new revision).

The number of revisions to a work is unlimited. Next, the work is either rejected and re-assigned or approved 606 for publishing by a user with the correct permissions (e.g. project manager, account admin, worker and the like). Finally, the approved revision is cataloged and assigned a version number 607 by the revision control module. The version also receives a unique Key along with the same data items as a revision. Only versions of a work are published 608 to a database 609 and made available for public viewing and use.

The system determines based on the user permissions, if the new revision is to be published to the master database or to the individual user's private data collection. A privately published change at the user's option, may or may not be made available to the system public domain, this is defined at the account or project level. Revision and version history is available to user's subject to their permissions.

There are many purposes for revision and versioning control but there is no effective way of performing effective change management of GIS data without revision and versions control. If we continue with our property information project example, revision control when creating wireframes of structures becomes valuable should the need to reverse a work arise or if historical evidence is needed on a structure's dimensions, area/volume, or its associated attributes.

Figure 9:
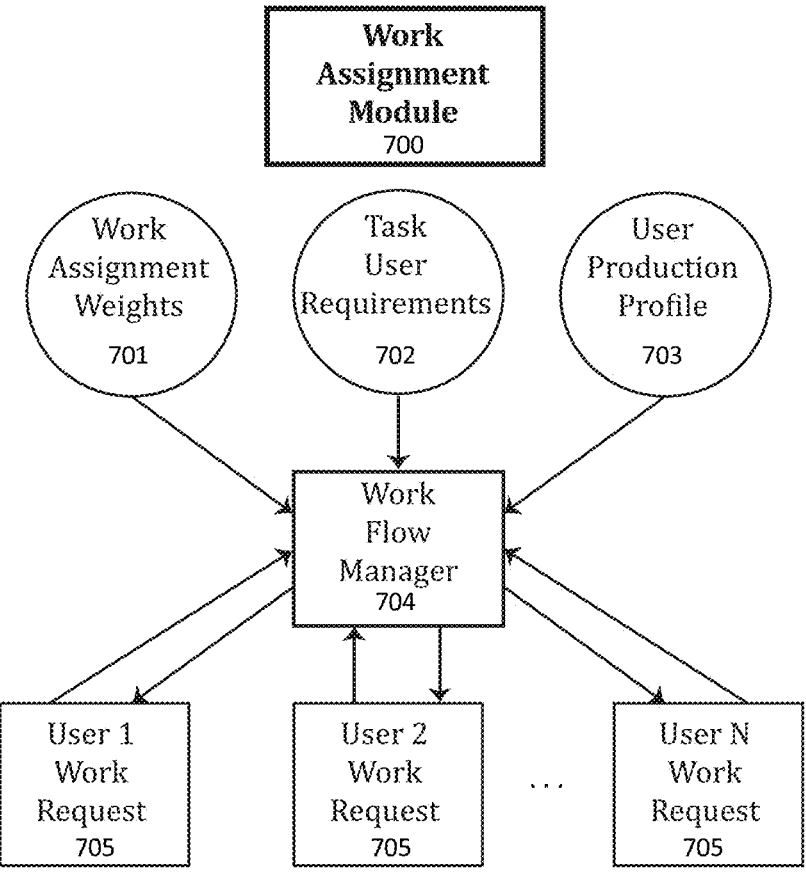
FIG. 9 shows detail of a Work Assignment module of the illustrated system and method in FIG. 2.

FIG. 9 shows further detail of a Work Assignment module of the illustrated system and method in FIG. 2. The invention automates the flow of work on all projects through a work assignment system 700. Projects are created and managed by users with the role of Project Manager (PM). Each project consists of jobs and each job is comprised of tasks. The PM designates the production workers or worker groups they wish to work on a job, this may be a single worker or multiple workers from the community. The PM sets a priority for each job with a beginning and expected completion date.

At the core of the work assignment module is a workflow manager automation system 704. The workflow manager uses data inputs from system sources; work assignment weights 701 (e.g. what project has the highest priority and then what work within a project has the highest priority), task user requirements 702 (e.g. what is the minimum proficiency rating a worker must have to perform work on a job task), and finally from the user production profile 703 (e.g. what is the workers current job task rating, projects approved for, availability). The workflow manager queries for these inputs each time a worker makes a work request 705, machine logic determines what the next work is for that worker and assigns it.

Figure 10:
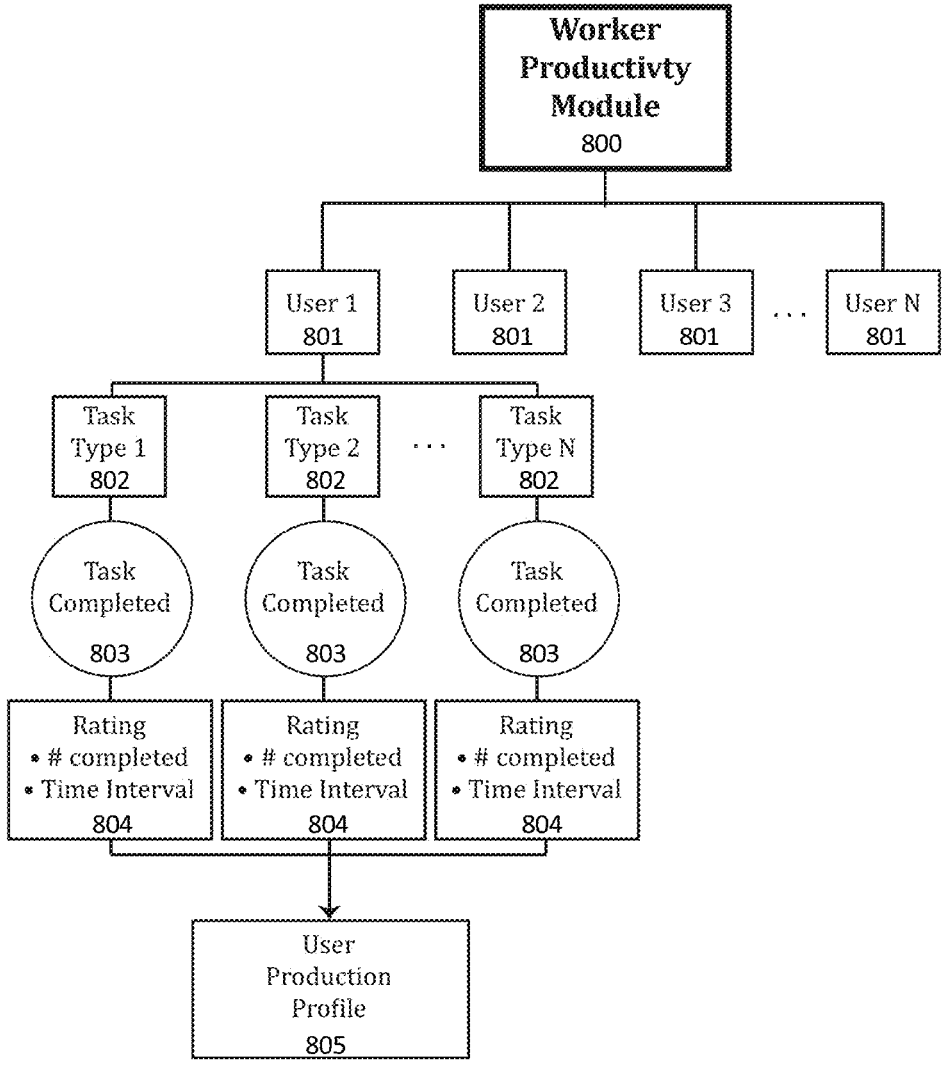
FIG. 10 shows detail of a Worker Productivity module of the illustrated system and method in FIG. 2.

FIG. 10 shows further detail of a Worker Productivity module 800 of the illustrated system and method in FIG. 2. The invention keeps track of worker productivity for purposes of but not limited to; auto-assigning of work by the system to workers and identifying need for additional training for workers. To do this the system tracks the metrics for but not limited to; (worker output by the job task type, quality of completed work (e.g. measured by how much work is rejected or sent for rework), number of skipped assignments by worker and the measurement of difficulty of work (e.g. difficult, average, easy).

Worker 801 requests work via the work assignment module, as the work is completed 803 and passed on by the worker, the worker productivity system catalogs an entry for the work including but not limited to; worker user ID, date/time stamp, job task type 802, work difficulty, project ID, and the like. The worker productivity module uses machine tools to evaluate the input metrics and generate a productivity rating 804 specific to the job task type which then automatically updates the worker production profile 805. The system generates an immediate rating for every job task type for every worker that has completed work in the system.

Figure 11:
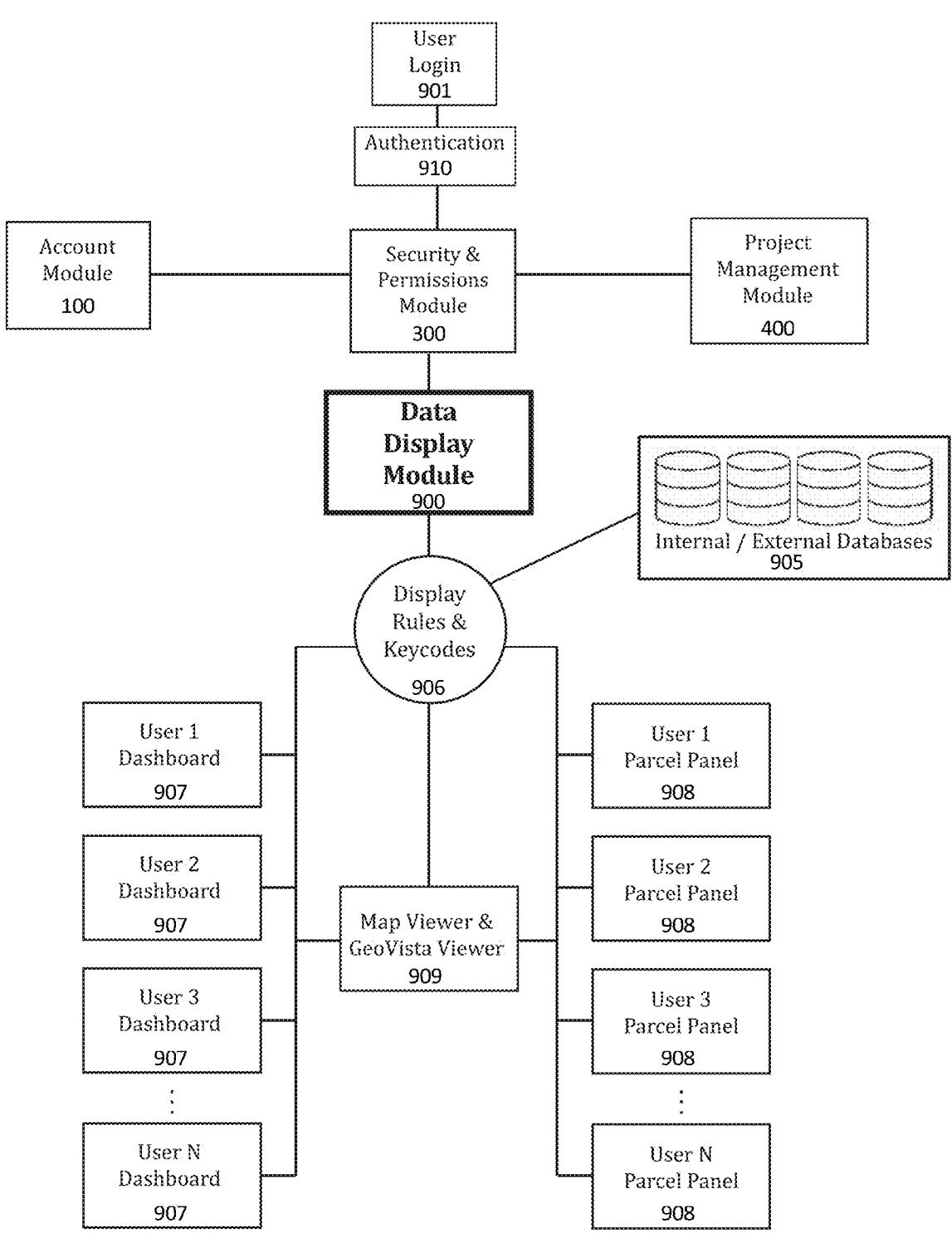
FIG. 11 shows detail of a Data Display module of the illustrated system and method in FIG. 2.

FIG. 11 shows further detail of a Data Display module 900 of the illustrated system and method in FIG. 2. A program module is responsible for managing the displaying of elements within the environment. Display properties are based on user permissions 300. User permissions are set by the account manager 100 and by the project manager as part of a project. When the user logs into the system 901 and is authenticated 910, the system sets the user's permissions. Display properties are managed by a Display Rules and Keycodes program 906. Keycodes are used to drive what a user may see and what data they have access to. The primary functional areas controlled by the Data Display module includes but not be limited to the User Dashboard 907, the Parcel Panel 908, the 2D Map viewer and 3D Map viewer 909 and the internal application database and access to outside 3rd party databases 905.

Security is a necessary component of any system that has multiple users performing different tasks, the Data Display Module 900 drives what the user may see and do based on the permissions set for them.

Figure 12:
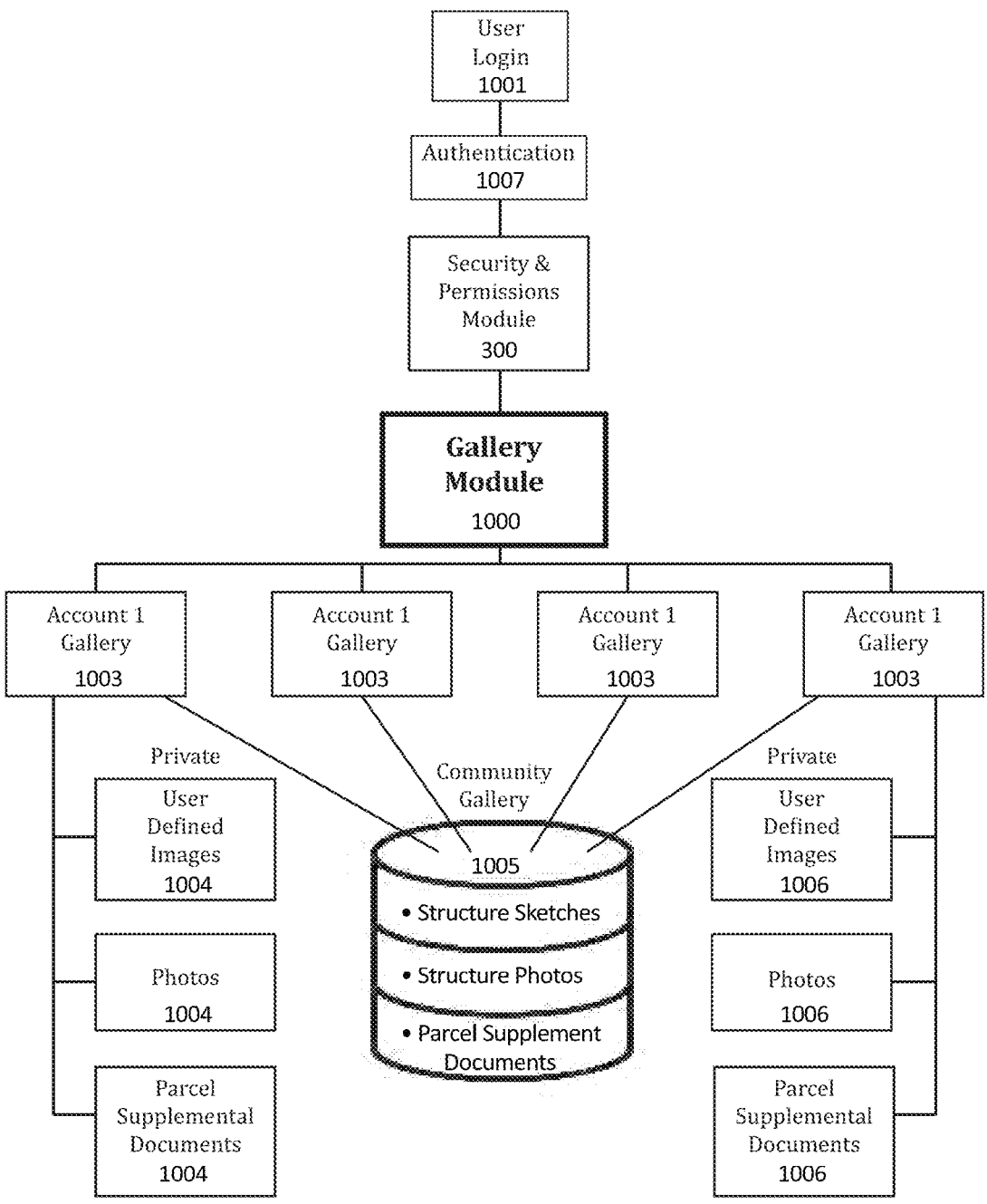
FIG. 12 shows detail of a Document & Gallery module of the illustrated system and method in FIG. 2.

FIG. 12 shows further detail of a Document & Gallery module 1000 of the illustrated system and method in FIG. 2. The invention supports a module for users to create and manage a document library. The library supports data elements created within the application as well as files uploaded to the system by the user. The library supports but is not be limited to managing the following data element types; cropped images created within the application, wireframes created within the application, graphic images uploaded to the system such as property photos and structure sketches. Upon a user logging in 1001 and then being authenticated 1007, the system sets security and permissions 300 as to what galleries the user has access to. The system supports a three-tiered hierarchy of Galleries; Community gallery 1005 (level 1-highest), Account gallery 1003 (level 2) and a User gallery 1004, 1006 (level 3). The galleries include but is not be limited to; mappable objects such as but not limited to structure wireframes, structure sketches in the formats of but not limited to; PDF,.png, jpg. gif,.svg, structure photographs in the formats of but not limited to; PDF,.png, jpg. gif,.svg, and supplemental documents related to specific man-made structure or to a parcel in the formats of but not limited to; PDF, doc, doc2, svg, rtf, txt. Any gallery object is available for download, sometimes at no charge and sometimes for a fee. The Gallery module manages the life-cycle of gallery objects based on Account level preferences.

Figure 13:
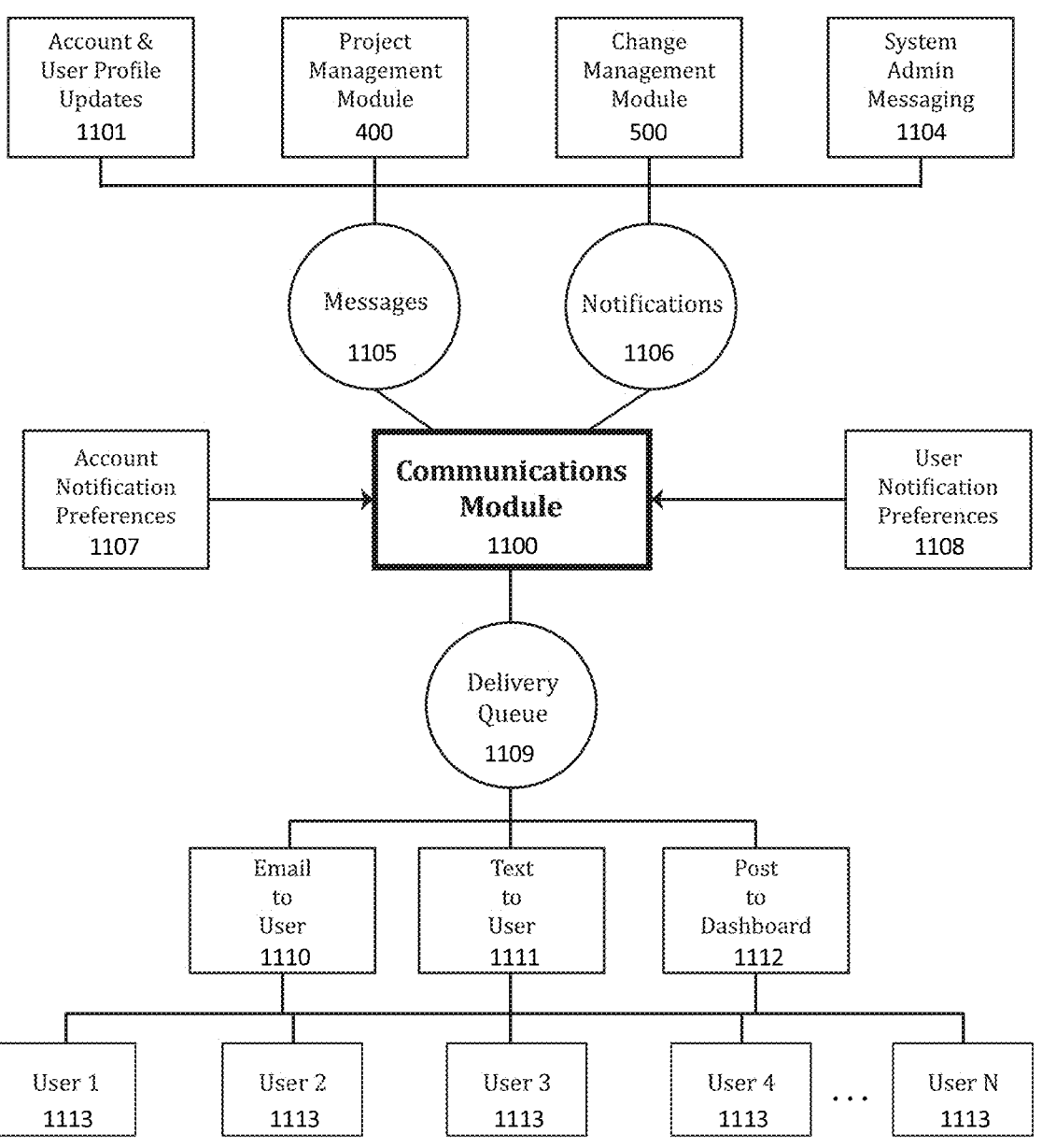
FIG. 13 shows detail of a Communications module of the illustrated system and method in FIG. 2.

FIG. 13 shows further detail of a Communications module 1100 of the illustrated system and method in FIG. 2. The invention contains a service that manages all communications both internally and externally between users and between users and the system. There are two types of communications the system supports; messages 1105 and notifications 1106. Messages are communications between the system administrator and users 1104 or user to user (one-to-one or one-to-many). Notifications are auto-generated communications by the system for events such as but not limited to user profile change 1101, project, project job, project job task status changes, project comments, assignment changes, project, project job, project job task detail changes or document or file updates (module 400), and structure changes (module 500).

Messages and notifications are delivered to users as desired by preferences. There is a minimum of two levels including Account level 1107 and User level 1108 preferences. An account administrator is responsible for setting whether a user may send or receive messages and notifications. The user may then set preferences to include but not be limited to the following parameters; frequency, deliver to email, deliver to text, post on dashboard, criteria for change notifications using structure attribute data.

A service known as the Delivery Queue 1109 is responsible for the distribution of messages and notifications based on account and user preferences. Distribution may go to butnot be limited; user email address 1110, user text 1111, user dashboard 1112 which is accessed by the user 1113. Messages sent from User to User is sent from the sender's email address (To) to the recipient's email address. Project comments are sent as notifications and when a user replies to the notification it is returned to the system and logged as a new comment on the project the comment originated from.

Every user is required to complete a secure and double authentication procedure to validate their email address and phone number for text messages. Upon creation of the users record or any change to the user's email address or text number the system sends an email or text and the user is required to click a link in that notification that-authenticates their identity as the owner of the email or text number.

Figure 14:
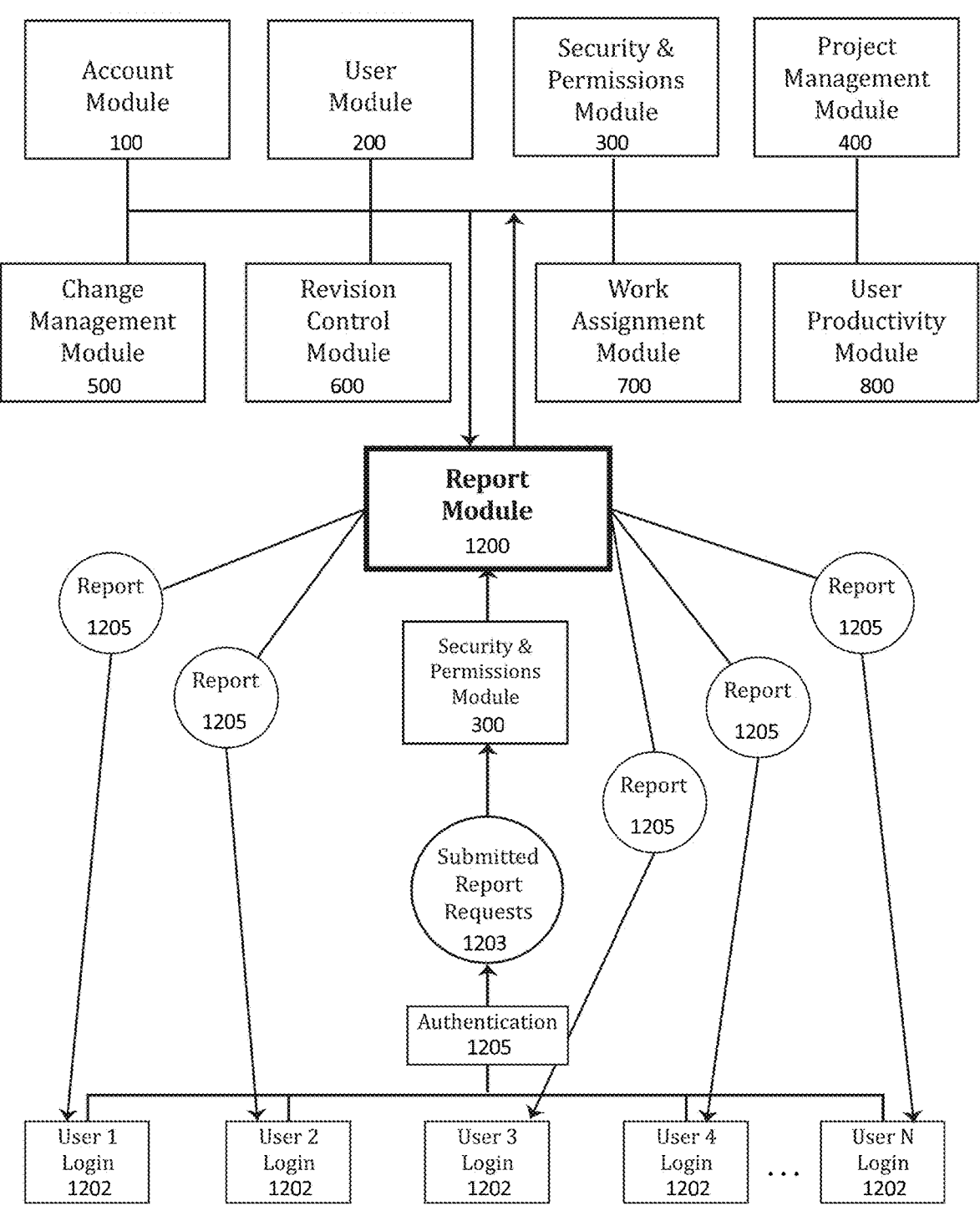
FIG. 14 shows detail of a Reporting module of the illustrated system and method in FIG. 2.

FIG. 14 shows further detail of a Reporting module 1200 of the illustrated system and method in FIG. 2. The invention has a service that manages all report generation for all modules. There is a series of standard reports that accept inputs from a user to filter the report by but not be limited to specific date ranges, include/exclude data elements/fields, and set sorting preferences. There is a minimum of two classes of reports: System Administrator reports reserved for the system owner/operator and User reports. User reports are accessible based on Account level permissions and User level permissions. Account level permissions are managed by the System Administrator and User permissions are managed by an Account Administrator. Reports are distributed to users in several formats to include but not be limited to; HTML, PDF,.csv,.txt, or .xls.

Users 1202 log in to the system which authenticates 1205 and validates their security and permissions. As they navigate between system modules 100, 200, 300, and 400 the reports available to them are managed by permissions set by the System Administrator and the Account Administrator. The user makes a report request 1203 whereby the request is validated by the security and permissions module 300. If the request is approved, the request goes to the report module engine, generates the report and distributes 1205 back to the user in desired delivery format.

The system includes but not limited to the following System Administrator reports: Account reports including contact lists, users lists, security and permissions of users; account system and resource usage such as order history, billing and invoicing, change notification to users, change notifications to system administrator; data set detail lists including date received, source, owner, database location of data, count (number or miles), description, maintenance; user productivity information by job task type, job time, number jobs skipped, number completed by job difficulty; and project detail, project summary, project status detail, project status summary, and project timeline.

The system includes but is not be limited to the following User reports: User productivity by job task type, time, number skipped, number completed by difficulty, project detail, project summary, project status detail, project status summary, project timeline, job task assignments (completed, not started, in progress, cancelled), user availability (workload, available time), structure reports; by state, geographical area, by customer defined lists, by changed data range, parcel history, approved for tax assessment, change notifications (hourly, daily, weekly, monthly), Account order history (by date, user, product ID or description), account profile, user profiles, user contact lists, user permissions, worker assignments, gallery objects (wireframes, sketches, photos, documents, files).

Figure 15:
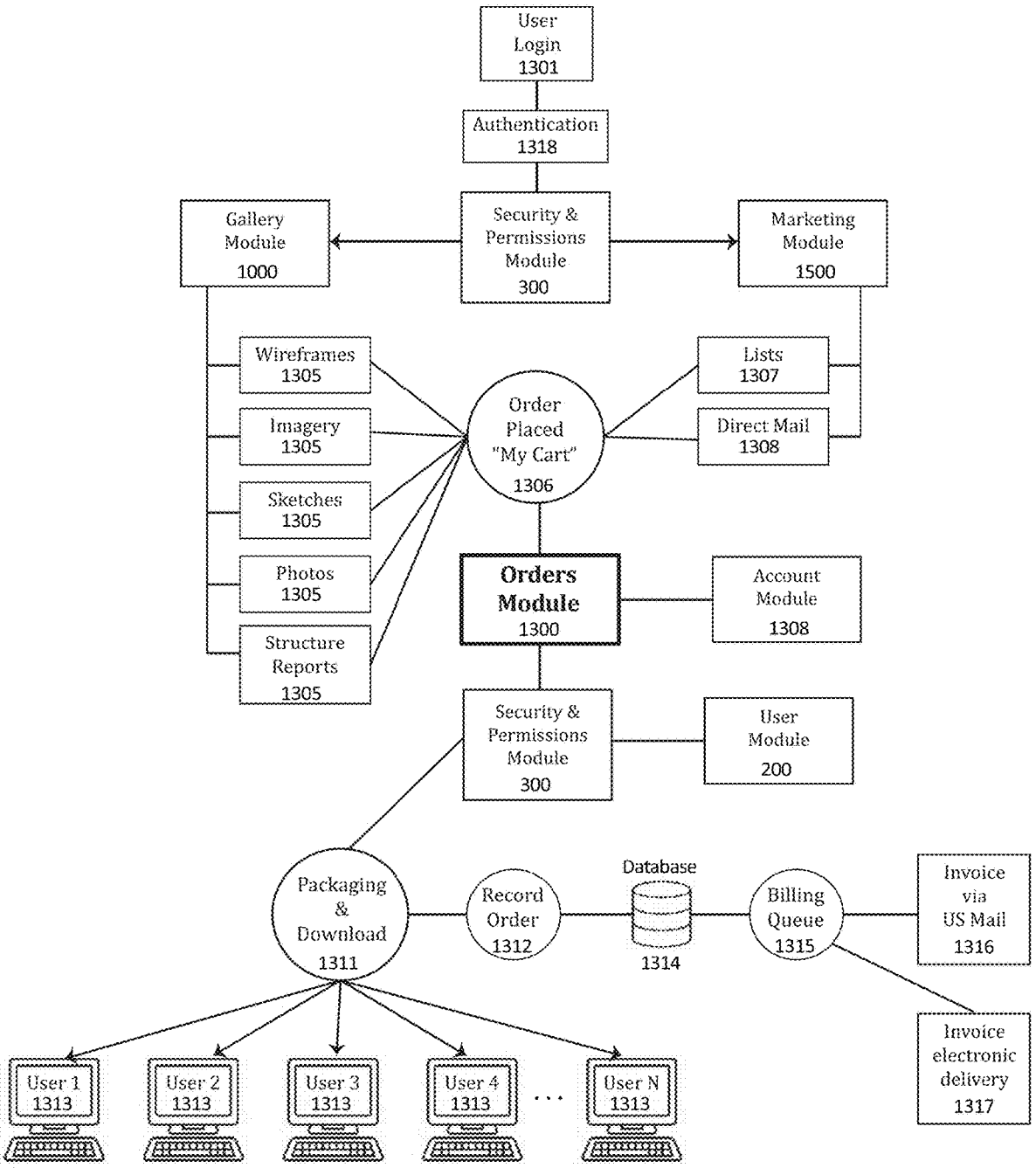
FIG. 15 shows detail of an Orders module of the illustrated system and method in FIG. 2.

FIG. 15 shows further detail of an Orders module 1300 of the illustrated system and method in FIG. 2. The invention includes an ordering module whereby users may purchase products via the system. Products may be ordered from but not limited to the following modules; Gallery Module 1000 and the Marketing Module 1500.

At a minimum, the Gallery module 1000 offers the following products 1305 such as 3D Wireframes (rooftop, foundation, walls or complete structures), Imagery (snap shots of aerial imagery (standard or user defined, ortho or oblique), Structure Sketches, Photos (supplied by varying sources) and Structure reports (example but not limited to roof, wall, and floor) with bill of materials and replacement costs, county record data report (current and historical).

The Marketing module 1500 offers a minimum two types of products: contact lists 1307 and direct mail products 1308. Contact lists are designed for prospecting purposes.

Users are allowed, per their permissions, to data mine the attribute data and build marketing lists 1307. The marketing lists may be downloaded for use in outside marketing systems or they may be used to order a direct mail product 1308 from the system.

Users log into the system 1301, then be authenticated 1318, and based on their security and permissions 300 access the Gallery Module 1000 or the Marketing module 1500.

When a product is ordered the users are validated against permissions set in the Account module 100 and User Module 200, if validation fails the user is denied the ability to add the product to the users "My Cart" 1306. If validation is successful, then the product is added to the "My Cart". When the order is confirmed/completed by the user the products are moved to the Packaging and Download process 1311. All products are treated as downloads to the User's desktop 1313 except direct mail products, those are sent to a fulfillment center for processing.

After an order has been processed (e.g. downloaded or sent to fulfillment) the order details are recorded 1312 and saved to a database 1314 where a billing queue monitors the system for completed orders and when completed then an invoice is generated and sent to the customer based on invoice delivery preferences set by an Account Administrator. Invoices are distributed via US Mail 1316 or electronically using email 1317.

Figure 16:
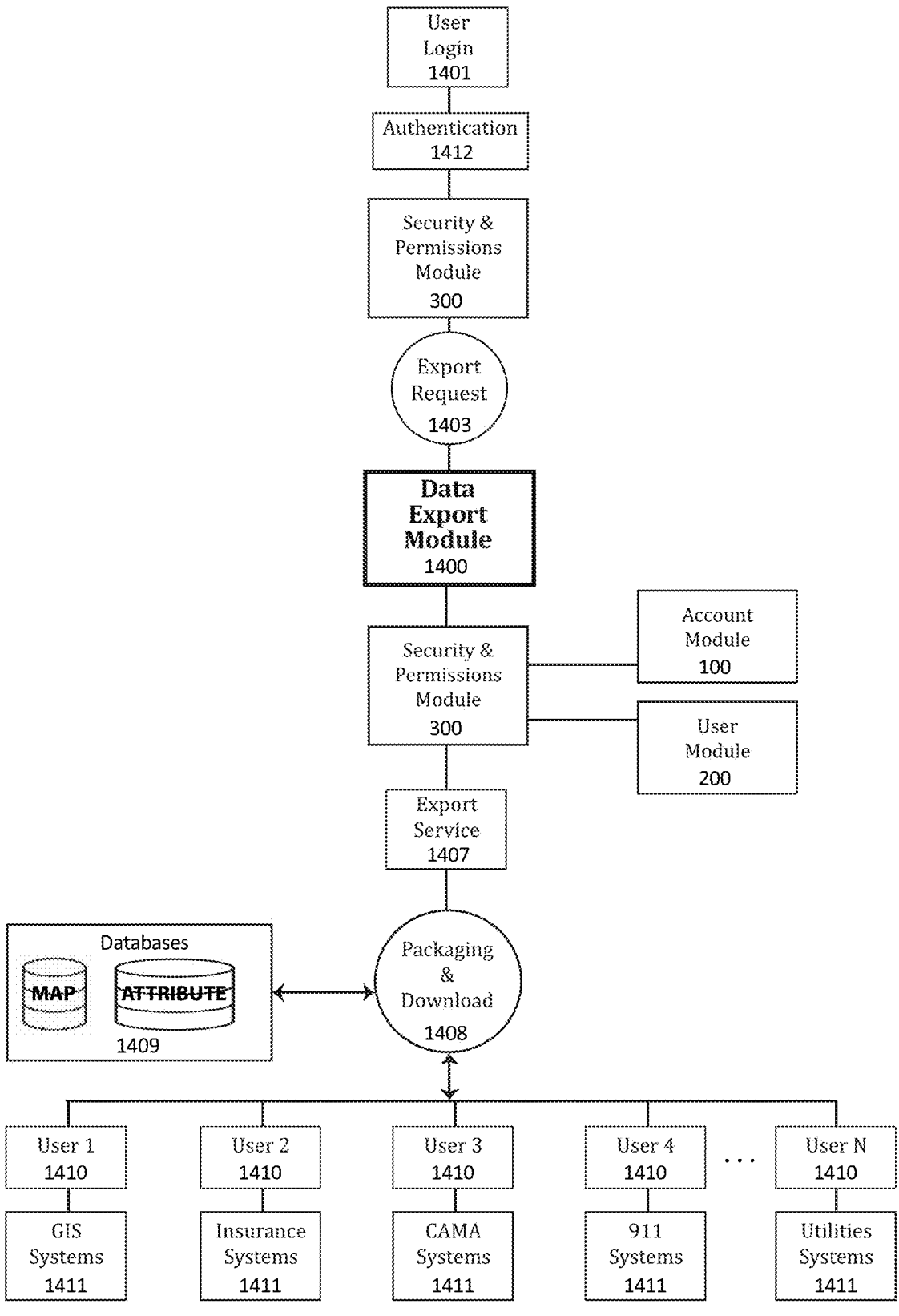
FIG. 16 shows detail of a Data Export module of the illustrated system and method in FIG. 2.

FIG. 16 shows further detail of a Data Export module 1400 of the illustrated system and method in FIG. 2. Some subscribers to the system may export data from the core system to external systems using the Data Export Module 1400. The system supports but is not limited to the following data types available for export; map data and parcel data and structure attribute data.

The user logs into 1401 the system for authentication 1412 and is validated for access permissions 300 to areas of the system. If the user executes a request 1403 for an export of data, it is sent to an Export Request Queue which is part of the Data Export Module engine. The system validates with module 300 the user's export request to approve or reject the request based on the user's permissions from the Account module 100 and User modules 200. If the request is approved the data export request along with defining criteria are passed to an Export Service 1407. The Export Service processes the export request using a packaging and download service 1408 that uses the criteria to extract the appropriate map data 1409 or attribute data 1409, package and download to the user 1410. The exported data may be used in various external systems 1411 including but not limited to GIS systems, Insurance systems, Computer Assisted Mass Appraisal (CAMA) systems, 911 Emergency systems, utility (e.g. electric, hydro, gas, wind) systems.

Figure 17:
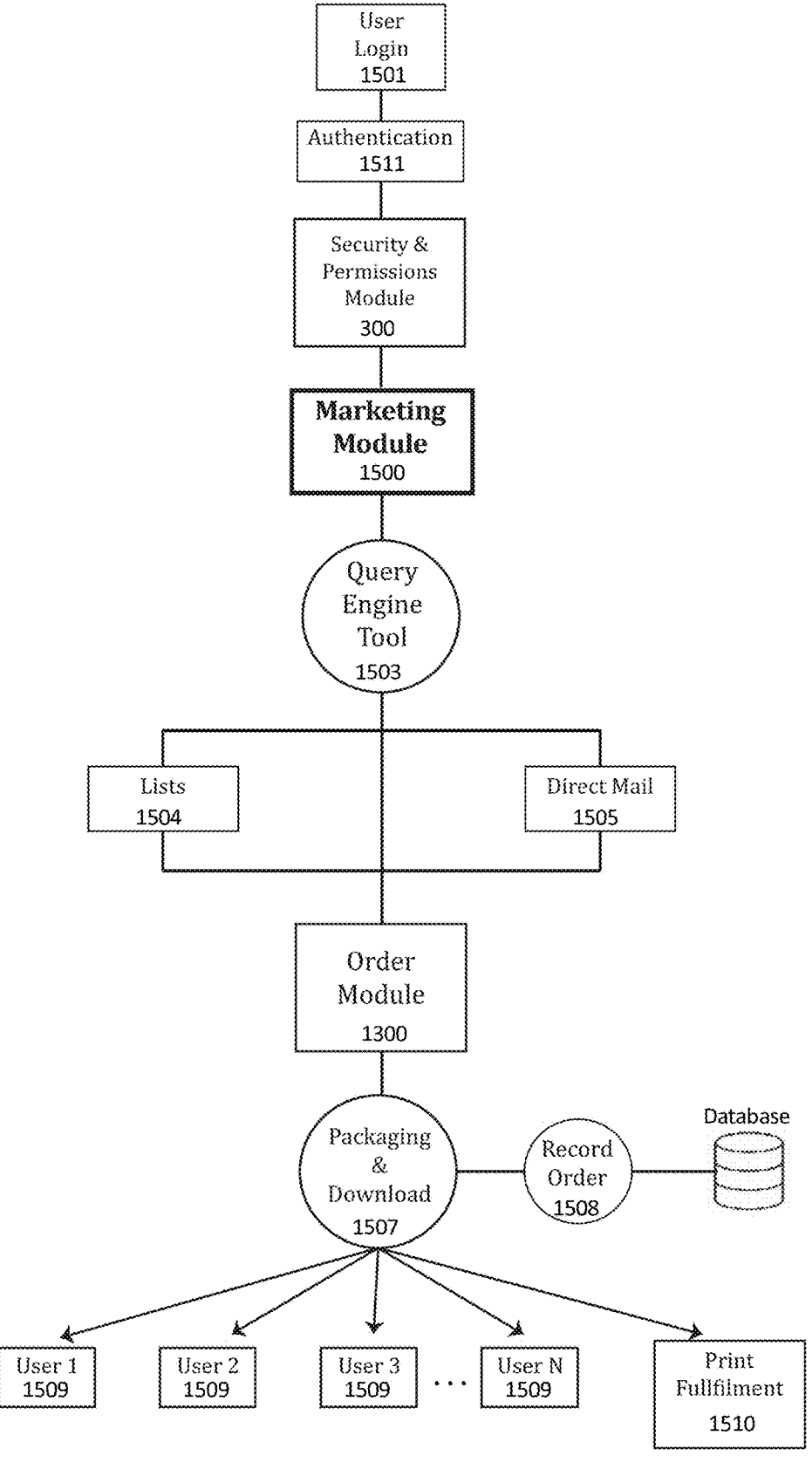
FIG. 17 shows detail of a Marketing module of the illustrated system and method in FIG. 2.

FIG. 17 shows further detail of a Marketing module 1500 of the illustrated system and method in FIG. 2. The invention contains a system for users to data mine the structure attribute data sets for marketing purposes. Once a user logs into the system 1501, the system authenticates 1511 and validate the user permissions with module 300 to verify whether the user has approved access the marketing module 1500. The marketing module 1500 provides a query tool 1503 for defining and building marketing lists. Once the user has created their distribution list, they may determine what type of marketing product they wish to order.

Marketing products include, but are not limited to, marketing lists 1504 for export and direct mail products 1505. Direct mail products include but is not limited to; postcards, form letters, brochures and newsletters all branded for the Account. Once a marketing product has been selected it is sent off to the Order Module 1300 for fulfillment. If a marketing list was ordered, it is packaged 1507 and made available for download to the user 1509 and then a record of the order 1508 is saved to the database for billing purposes. If a direct mail product was ordered, then the product data (distribution list, direct mail template art) is sent off to the fulfillment center 1510 for production and distribution.

Figure 18:
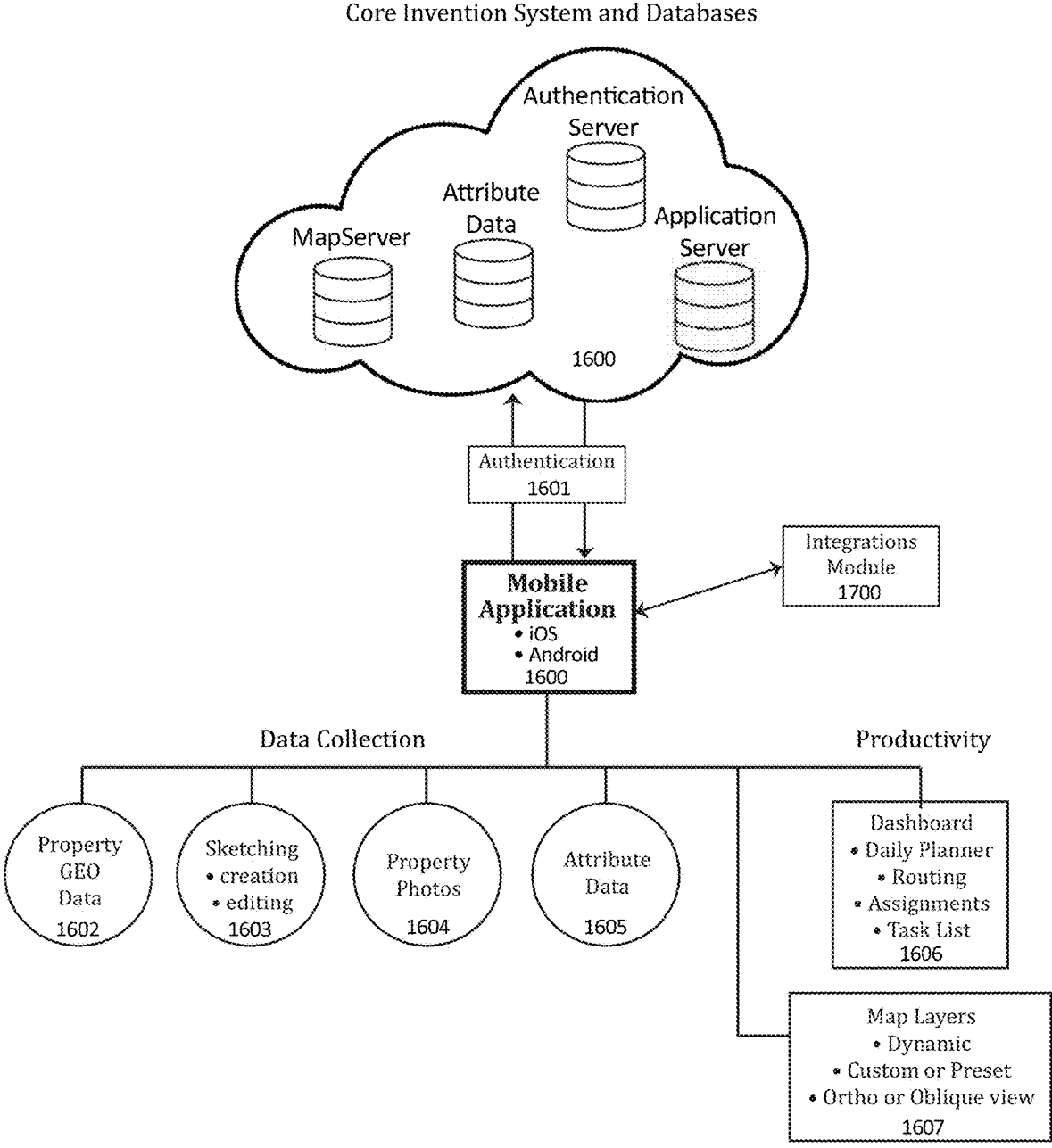
FIG. 18 shows detail of a Mobile Platform Application of the illustrated system and method in FIG. 2.

FIG. 18 shows further detail of a Mobile platform version (mobile application module 1600) of the illustrated system and method in FIG. 2. The invention supports a mobile platform program that provides similar functionality as the primary invention. GIS projects often have a need for "field operations". Those field operations may include tasks or activities such as but not limited to data collection, data editing/manipulation and data verification, sketching of structure outlines, editing of sketches and sketch verification. A variety of sensors are available to make measurements in the field. The invention supports full integration of products such as Structure Sensor 1708 (FIG. 19) by Occipital, Inc. located in San Francisco, CA which is an addon to the iPAD that allows for complete 3D scanning of building interiors. Specifically, the addon is a mobile 3D sensor that gives the iPad the ability to perceive depth and "see in 3D." It combines that data with the iPad's color camera and IMU to create a 3D model. Leica Geosystems markets a product called Disto 1710 (FIG. 19) which makes measurements between two points using a laser beam. The computed distances are transmitted with the mobile application using a Bluetooth interface.

The mobile application supports integration directly with the primary invention in real-time using the Internet as a transport vehicle or maintains its data stores in an off-line mode until the user's device is able to establish a network connection to the Internet.

A User may launch the mobile program application on their mobile device which automatically authenticates 1601 and upon authentication connects to the primary databases which are hosted in the cloud. A dashboard similar to the primary invention displays projects, project jobs, and tasks the User has been assigned 1606. Before the User leaves the office, a routing feature displays the parcels or locations the User must visit as part of the day's activity and generate a driving route 1606 that guides the user from location to location. When the User arrives at a location, they execute the assigned tasks from their task list 1606. This may involve but not be limited to; creating or editing structure sketches 1603, collecting or editing attribute data 1605, taking photographs of parcel elements such as building structures 1604, or capturing video and recording geographic coordinate data for elements on the parcel 1602.

While users are conducting their assigned job tasks, they may also use productivity tools 1607 such as but not limited to; 3D map layers, create map layers using attribute data as criteria and view orthogonal or oblique imagery with map layers overlaid upon them. As the user completes and saves his or her work, each save triggers a synchronization process where the mobile application software pushes all new edits to all data types since the last synchronization. This real-time productivity allows staff in the office to view field operations data immediately via the primary invention.

Figure 19:
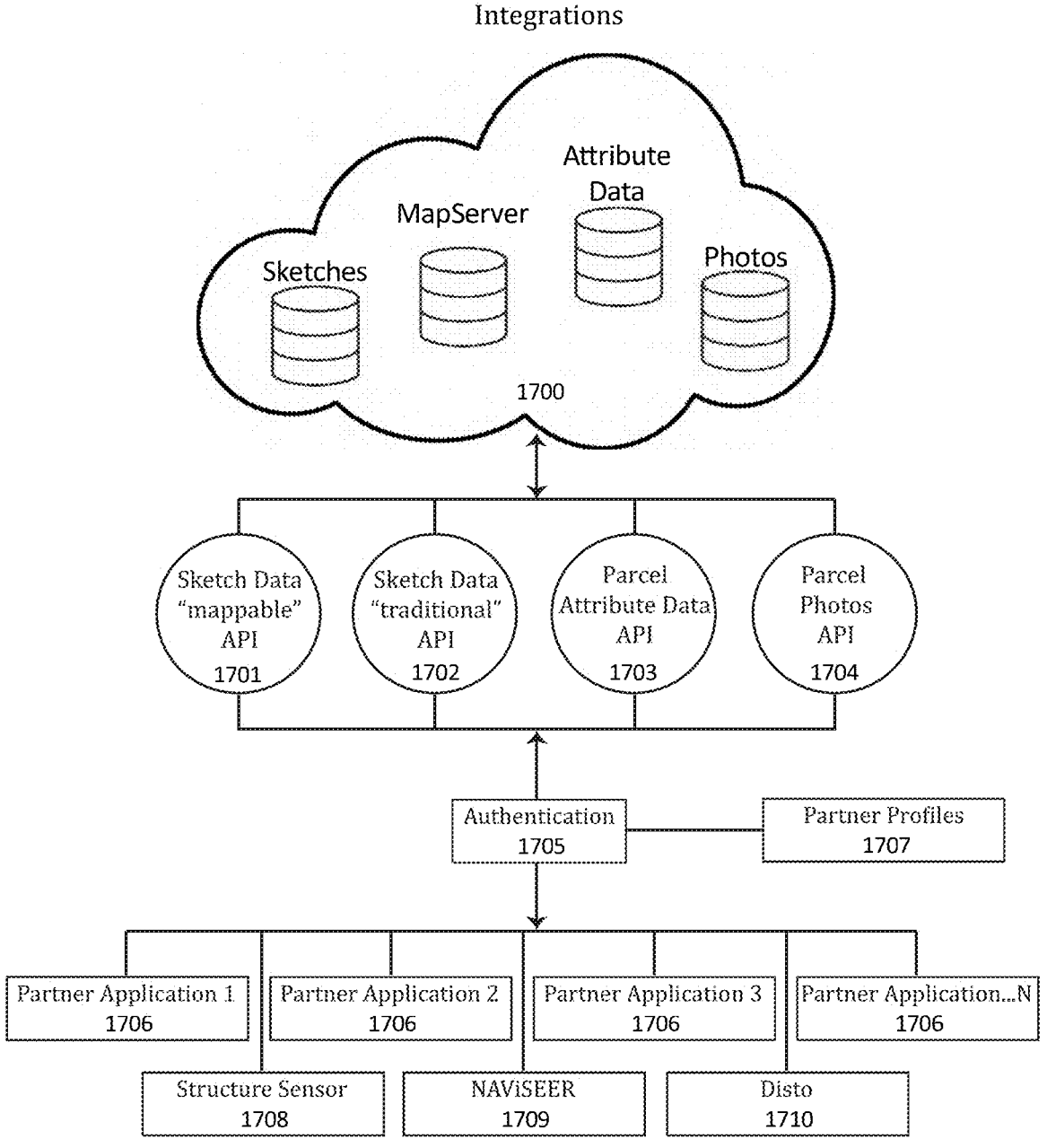
FIG. 19 shows detail of an Integrations module of the illustrated system and method in FIG. 2.

FIG. 19 shows further detail of a 3rd Party Integration platform (integration module 1700) of the illustrated system and method in FIG. 2. The invention supports an integration platform for use by 3rd party systems that desire access to the data within the invention. This integration module 1700 uses an API library that allow 3rd party partners 1706 access to both pull and push data to the master databases of the invention. Partner profiles 1707 drive what API each partner may have access to including read push and pull permissions. The partner profile permissions are applied when the partner is authenticated 1705 during the time a partner makes a request to the system. Since the API's are directly integrated with the master databases of the system, the Integration platform supports the access of system data from both the primary invention and the mobile platform application. This is valuable particularly for the users of the mobile platform application because it allows for the mobile application to communicate with any 3rd party system that supports the GIS system's API specifications.

The invention allows display of live real-time camera feeds showing the inside and outside of structures, static photos or archived video showing the inside and outside of structures, and real-time tracking of 3D position inside buildings make the invention a critical advancement for building security and emergency response situations. A personal tracking system manufactured by Seer Technology of Salt Lake City, UT and marketed as NAViSEER 1909 is currently the preferred system for creating a video 3D track or photo 3D track inside of buildings. It is also the preferred system for real-time tracking of First Responders inside buildings.

3D Perspective View Drafting

Traditional drafting is typically done in orthogonal views (normal to the viewer). The individual orthogonal drawing views are drawn to scale based on known measurements.

Assessors use this technique at their discretion to create sketches of each taxable structure. The first challenge with orthogonal sketching is that the assessor must be onsite to make the physical measurements of the structure and accurately transfer the measurements to the sketching software. Remote measurement is not sufficiently accurate for sketching buildings from orthographic imagery because the foundation is not visible from orthographic aerial imagery for most buildings. Remote measurement from oblique imagery is possible as described in U.S. Pat. Nos. 5,633,946 and 5,633,946 C1 but accurately transferring the measurements to the sketching application is time consuming and error prone. Perspective view drafting allows the user to accurately and efficiently sketch building structures at the roof level or at the foundation in any oblique view necessary to sketch a complete building without knowing any measurements. Change Management is enabled by perspective view drafting because all sketches are defined by real-world coordinates allowing them to be projected into new oblique imagery as it becomes available for validation and/or edited to create a new version of the structure.

To provide change management for man-made structures, periodic aerial oblique imagery supplemented by available LiDAR (or equivalent active measurements) is needed to automatically create the geometry for the made-made structures. Even with maximum automation of man-made structures, a perspective view editor is still needed to overlay existing sketch records against the imagery and LiDAR to check the accuracy of the sketch and to make any modifications that may be required.

The invention allows the draftsperson to draw in any perspective view of the structure without knowing the actual measurements of the structure. Perspective view drafting is performed directly in individual perspective views each of which present at least part of the object. The structure is defined in real-world coordinates (such as WGS84xyz) by simply reconstructing its 3D geometry in various partial perspective views. Intelligent camera systems use GPS and inertial motion sensors to establish the position and orientation of the camera at the instant the image is captured. Other methods of establishing the perspective view of the object are acceptable to determine the viewer location including well known reverse engineering techniques. In the case of viewing a Digital Surface Model (DSM) or 3D point clouds, the perspective view may be set dynamically to obtain the desired view.

The perspective view of a scene is mathematically defined by the rotation matrix shown in FIG. 21 where the origin (0, 0, 0) of the coordinate system is the view point. Although any Cartesian coordinate system may be used, WGS84xyz coordinates have their origin at the center of the earth. Our examples refer to WGS84xyz coordinates because they are easily converted to Latitude, Longitude, and Height. This is the established coordinate system of the GPS satellites, so it is a natural coordinate system for a real-world 3D GIS. The x, y, and z components of any given vector are relative to the origin of the view. If the perspective view is the focal point of a camera, the real-world location the camera focal point must be added to the relative vector components multiplied by the magnitude of any vector to obtain the coordinates of any given pixel.

A good reference to the basic understanding of 3D coordinate systems, 3D points, vectors, the length of vectors, DOT products, and Planes is: A first Course in Linear Algebra, 2nd Edition by Daniel Zelinsky, Library of Congress Catalog Card Number: 72-88368

The perspective view rotation matrix shown in FIG. 20 defines the vector going through the center of an image with any given yaw, pitch and roll now referred to as Vector C in FIG. 21 for the center of the image.

Because the optical center of the camera is the origin for the analysis, a pixel and its vector (the line connecting the origin to the pixel) are described by the same triple of numbers relative to Vector C. The Ray (vector) going through any pixel in the image is calculated by multiplying Vector C by the relative vector represented by the pixel coordinates of the selected point (zp, xp, yp) with zp=1.

The pixel may be adjusted for any lens distortion (if applicable). For example, a simple radial cubic lens distortion may be applied as follows: Recompute the pixel location $yp=yp.F3$ and $xp=xp.F3$ (where F is the distortion factor) and then compute the RAY (vector) going thru the adjusted pixel coordinates. Similarly, more complex adjustments may be made as required including but not limited to USGS lens distortion factors and polynomial equations.

When using the perspective drafting tools in existing 3D point clouds or digital surface models without a background perspective image, no pixel adjustment would be needed.

The roll, pitch, and yaw of a given pixel of an image requires knowledge of the image to screen canvas mapping. Since we are looking for the image pixel vs the screen canvas pixel, we need consider the offset and scale of the image vs the canvas and any pixel adjustment due to lens distortion. The system uses the overall image size and focal length using well established formulas to convert the screen canvas pixels to image pixels and back. This involves knowing the canvas pixel origin and its image pixel offset as well as the scale difference (zoom factor) between the two.

Perspective view drafting is performed directly in individual perspective views which present at least part of the object. It is necessary to know the perspective view of the image, the image calibration parameters, and the distance to the object which is computed using the "ray-to-plane" formula as defined in U.S. Pat. Nos. 5,633,946 and 5,633,946 C1.

$$L=\|D\|^2/U \cdot D$$

It is well known in vector mathematics that the dot product of two vectors is a number that is the magnitude of the first vector times the magnitude of the second vector times the cosine of the angle between the vectors. FIG. 22 illustrates the derivation:

A plane in 3-D is commonly defined as a quadruple of numbers (a, b, [d] c, & d). Any point P=(X, Y, Z) lies in the plane if:

$$a*X+b*Y+c*Z=d$$

In order not to confuse vector D with the scalar d, lets substitute the letter e for d. Then:

$$a*X+b*Y+c*Z=e$$

If the values (a, b, & c) are treated as a vector, then Vector N=(a, b, c) and N is perpendicular to the plane which it defines, much like the short pipe sticking out of the triangle in FIG. 23. Furthermore, note that the equation of the plane may then be equivalently expressed, using vectors, as:

$$N \cdot P=e$$

As the camera views the plane, suppose that we want to know the location of a point in the plane. We select a pixel, let's say that it corresponds to triangle corner point P1 in FIG. 23. Selecting that pixel defines a direction vector U in camera coordinates, but we don't yet know how long U should be for the end of the vector to line in the plane.

Once the Ray (vector) and length of the vector is computed, it is a simple matter of determining the real-world coordinates of the selected pixel or to convert real-world coordinates to image pixel coordinates (and ultimately canvas pixel coordinates). The Ray (vector) times its magnitude L calculates the selected real-world coordinates relative to the location of the perspective view real-world origin. So, we add these relative coordinates to the real-world coordinates to obtain the real-world coordinates of the selected pixel. To display the real-world coordinates in a specific perspective view, the entire process is reversed. First, the WGS84xyz coordinates are processed through the inverse rotation matrix for the perspective view. Next, the x and y magnitudes are divided by the z to produce the pixel coordinates within the image. Then any distortion is reversed and finally, the image coordinates are mapped back to the screen canvas coordinates.

Every facet created by the system defines a geographic plane that may be used to employ the "ray-to-plane" formula as defined and discussed in the 3D Topology and 3D Model Change Detection sections below. If multiple facets overlap, any one of multiple facets may become the active plane for calculating its real-world coordinates when a pixel location is selected.

The user may dynamically set the viewer location and perspective view when the camera view is not needed to create or edit a 3D model. Existing 3D point clouds, 3D model templates and existing drawings may be inserted into the scene for editing. The user may also select an ortho mode which permits the user to use a camera view model that emulates viewing and accurate editing in 3D orthographic imagery. This is accomplished by setting the viewer location directly above or below the structure location at a distance sufficient to provide accurate results.

When working with real-world coordinates such as WGS84xyz, it is advantageous to make calculations in the local North, East, Down orientation. For example, the user may wish to know the bearing of a structure edge or may want to know the slope of a roof facet. These calculations are simplified by creating a structure orientation (rotation) matrix.

Then, operations like squaring, scaling, rotation display bearing, display slope, etc. are done in the local North, East, Down (NED) orientation. One way to accomplished this is by converting from WGS84xyz to WGSLLH for the first point in the structure and setting the structure rotation matrix where:

Pitch=Latitude, Roll=Longitude, and Yaw=0.

The structure rotation matrix is given by:

$$\begin{pmatrix} -\sin Lat\cos Lon & -\sin Lon & -\cos Lat\cos Lon \\ -\sin Lat\sin Lon & \cos Lon & -\cos Lat\sin Lon \\ \cos Lat & 0 & -\sin Lat \end{pmatrix}$$

This matrix transforms WGS84xyz coordinates to perform mathematical calculations in the local NED coordinate system. The inverse matrix is used to convert back to the real-world WGS84xyz coordinate system.

To facilitate a full definition of the 3D model, Perspective View drafting allows alignment and editing of partial 3D models in any other perspective view of the structure/object. Since the drawings are simply moved to confirm their accuracy in each view, the associated image pixels are also locked into the particular view of the drawing for realistic rendering of the 3D models. This capability is useful for accurately modeling and editing real world objects shown in natural image and/or 3D point clouds and/or Digital Surface models.

FIG. 24 shows a sketch created in natural oblique images with the 3D Perspective Drafting Tool.

FIG. 25 shows a diagram illustrating the main processes of the perspective drafting tool used to create and display 3D models of man-made structures from 2D perspective images.

2D perspective images may be obtained either from an aerial flight or other moving platforms or even hand-held cameras. In order to perform 3D computations and accurate rendering of the drawings on the imagery, the images require associated camera metadata such as the camera's real-world 3D coordinates on earth, orientation, focal length, and either an undistorted image or lens calibration information defining its principle point and distortion formula. The metadata may be generated by the spatially accurate camera systems or reverse engineered by well-known methods.

Once the image and metadata are received, the camera information is then fed into the 3D engine to set up the camera matrix transformations for the image. This matrix is used to convert 3D points to 2D screen coordinates with respect to the image, or to convert 2D points selected in the image to 3D real-world coordinates. An example of 3D coordinates would be WGS84 coordinates which may be converted into any other 3D real-world coordinate system.

3D drawings may be drawn from scratch or may be imported from a geographical or geospatial data file containing either 2D or 3D coordinate points, which may come either from a previous version, converted from external sources, or even converted from scanned images. In the event of importing 2D coordinates, the Z (elevation) value is determined for each point on the ground using an existing digital elevation model. The elevation is computed using an iterative or modified "ray-to-plane" formula. The first attempt uses an estimated elevation defining the ground plane. If the altitude for the projected point is above the elevation in the digital elevation model for the projected location, a second iteration is attempted with a new estimate somewhat lower than the first. This process is continued until the projected location has an elevation less than the elevation in the digital elevation model. The projected point is altered forward or back along its pixel ray until its elevation is less than or equal to a desired tolerance.

3D coordinates, if they exist are now transformed into 2D screen coordinates to be projected on the image. These 2D points changes if the image behind it changes to a different view, say from North looking angle to East looking angle. Any point picked in the image is transformed into 3D real world coordinates as well.

Metadata keys are associated to the 3D object before it is saved to the database. These keys include but are not limited to a parcel number, structure number, component number, revision number, date, and a manufactured unique identifier. The unique identifier is needed to support linking attribute data with the historical or proposed versions of the 3D object as well as linking the 3D object with attribute information maintained in other systems. The 3D object coordinates represent its geographical position and may be used to retrieve the drawings by searching on those fields. One such application is retrieval of a specific land parcel. The associated drawings are retrieved if they exist and rendered specific to the perspective image that is currently being viewed. Attribute links also provide access to useful information such as sales literature, photos, videos for alternative material types and costs associated with replacement of existing building components or proposed construction. Such attribute links are also useful for live video feeds for security and emergency situations.

3D Topology

The invention is not limited to a specific topology. Other topology examples such as "TOPOLOGY FOR 3D SPATIAL OBJECTS" authored by Siyka Zlatanova, Alias Abdul Rahman, and Wenzhong Shi have been studied and documented together with identified advantages and disadvantages.

FIG. 26 illustrates one implementation of geometric element topology that create a 3D object and described here. Multiple 3D objects may be linked together to form components of a building of a certain property. FIG. 26 (a) represents the first corner node drawn that would represent the first corner of a 3D object. FIG. 26 (b) represents an edge, which are made up of two distinct corners. FIG. 26 (c) represents a facet of a 3D shape. Facets are made up of multiple distinct edges that form a closed polygon. Facets may be placed together with other facets to form a 3D shape (solid), as seen in FIG. 26 (d). A Facet can be subdivided in into two Facets by simply defining a new edge connecting any two points on the Facet polygon. Any attributes of the structure component received from various sources can be linked to the appropriate Facet. Attributes can be assigned (manually or automatically) to the individual elements of the topology to allow the attributes to be displayed in various colors as part of a wireframe representation of the 3D structure. Element attributes (also referred to object properties) may also be used to control complex structure modifications such as elevating a "roof ridge" element but automatically recomputing all affected facets of the roof structure based on rules associated with the assigned "roof ridge" attribute. Such element attributes facilitate, for example, dropping a 3D template component such as a window, door, or building dormer component into a building 3D structure model. Element attributes are also used to provide length and area subtotals and totals of structure component materials needed for determining replacement costs in a Bill of Materials.

3D objects are created using the techniques described in the preceding paragraphs. The "ray-to plane" intersect requires an active plane which may either be horizontal, vertical or sloped. First, we set up the perspective view matrix as previously discussed. Its origin is the real-world coordinates of a camera view or user defined view for existing 3D models. The real-world coordinates of structure origin are normally computed by using the modified "ray-to-plane" method previously discussed for finding the altitude using a digital elevation model. All other corners may use the standard "ray-to-plane" for the perspective view. Selecting a facet for editing is analogous to selecting a geometric plane. If there are multiple overlapping facets, any one of multiple facets may be selected as the active plane for editing its real-world coordinates if a corner is moved, an edge is moved, a facet is moved, or an entire structure is moved. For every such dynamic adjustment, all elements of the object are continuously converting from screen coordinates to real-word coordinates. This flexibility includes moving all or parts of a structure horizontally, vertically, and to change the definition of the drawing plane by elevating, for example, just a single edge in the drawing. Because a plane is defined by any three points, any three corners defining each Facet are used with the current perspective view matrix and geographic location to recompute the coordinates of all corners in the Facet.

Horizontal planes may be adjusted in elevation. They may also be manufactured, for example, to represent the multiple floors of a building. Vertical planes may also be manufactured, for example, to represent the wall of a building from the outline defining the building floor facet extended to the roof. Walls are not required to be vertical as the plane itself may be adjusted to any slope to fit the structure. Roof facets, or facets with slope may be defined automatically by using well known stereo and/or noncoplanar photogrammetric methods and/or manufactured using the "Ray to Plane" facet generation described herein and/or adjusting the facet slope to fit the structure in an appropriate perspective view of the structure as required.

Due to the nature of graphical and geographical geometry computation which involves complex matrix calculations previously discussed, the data obtained must to be stored efficiently and systematically to ensure smooth real-time graphics manipulation and rendering when the drawing is edited. One efficient way of storing and interacting with the points that make a 3D shape is to use an object-oriented programming approach where corner nodes, edges, facets and 3D shapes are stored as objects. Once an object is created, the objects are then referenced using pass-by-reference method from memory from other objects and functions when needed. This method minimizes overhead in terms of memory usage since it is only created once and referenced thereafter. It also ensures that the value obtained is always the right value and is in synchronization with all the functions that use it, since anything that uses that value references the same location in memory. Further, any functions or subroutines that modify the value of an object's property, such as recomputing new 3D real-world coordinates, updates the property directly before the subsequent functions access it. The single-threaded nature of the program ensures that there would not be any memory locking and waiting issues that may be present in other applications that use this approach.

FIG. 27 shows a visual representation of how corners and edges are linked together to form a facet. A, B, C, D represent unique identifiers. The program creates a corner object for each corner that is plotted in draw mode and stores the necessary properties related to that corner, such as 2D screen coordinates, 3D real-world coordinates, the object ID, and many more. Two corners are associated together in an edge object by referencing it, one being the start corner and the other being the end corner, therefore an edge has at most 2 corners, but a corner may be a part of any number of edges. A new edge is determined by drawing 2 corners in succession in draw mode or linking a new corner to an existing one. In the example in FIG. 27, corners A, B, C, D are plotted in succession, hence the program first creates corner object A, then creates corner object B and links it together in an edge object. Since the user is still in draw mode and has already drawn two points, a third click would now create corner object C, and link it to B, and same with C to D. After drawing all four corners, and now with three edges, the user clicks back to corner A to close the facet. Using this concept, it is easy to determine when a facet is formed, because the corners plotted are bounded by a finite chain of edges closing in a loop to form a closed polygonal circuit. The program checks to see if the corners are closed in a loop because the edges are all in the same direction, denoted by the start corner and end corner, and that the last edge's end corner is also the first edge's starting corner. The program now creates a facet object and references the corners and edges that make up that facet. By changing the plane of intersect, vertical facets or sloped facets may be drawn by connecting new corners to existing corners on the horizontal facet to from edges that then make up these facets in different planes. This essentially creates a polyhedron, comprised of multiple facets on different planes that reference common corners and edges. This information is enough to form a 3D object without duplicating any data or causing unnecessary overhead.

The hierarchy of objects mentioned above is very useful in the application of this program as opposed to storing it another way, say as just a collection of corner coordinates.

Since the program is not just a 3D modelling program but also a Geographic Information System application, more computations and data association are required in addition to keeping track of and editing the shapes on screen. Functionalities such as determining the geographic coordinates corresponding to a corner, geographic length of an edge drawn, geographical coordinates of centroid of the shape, linking of metadata information for the buildings or properties and more need to be calculated on the fly. Since an object has a predefined structure template, each object has a predefined property that may be referenced from memory when needed by the appropriate functions. An example is a corner dragged to a new location in edit mode. At all times, we have 2 sets of coordinates, one being the coordinates on the screen that have just been drawn, and the other would be the 3D real-world coordinates that are computed using the matrix that was set up with respect to that image. When the corner is moved, in this case by clicking and dragging the mouse, the screen coordinates are updated, and the 3D coordinates are computed immediately after by referencing the corner's screen coordinates from memory and store it back as that corner's 3D real world coordinates. Subsequently, the edges that share that corner have their distances computed by referencing the corner's new 3D coordinates and computing the distance to or from it. A facet's centroid is computed by also referencing the corner's new 3D coordinates. This allows, for example, one function to update the new value of 3D coordinates, and multiple functions accessing this new value with no extra memory usage.

One feature of this method is that since it keeps track of 3D real world coordinates, a drawing that is drawn in one image, say an image looking North of a building, may be rendered and projected accurately in another image of the same building taken from a different direction, say looking East. The 3D real-world coordinates of each corner are used to recompute the accurate 2D screen coordinates based on the information in the new image in real time. This method proves useful in many situations. One scenario is when constructing 3D drawings of a building that has some obstacles blocking it in that view. The 3D object may be constructed one edge at a time by drawing parts of the building that are not obstructed, then using a different perspective image of the same building taken from a different direction to complete the other edge(s) that is now not being obstructed from the new view.

This partial drawing in multiple images is possible due to object-oriented approach mentioned above, where the points associated to each other retain their properties until the values are changed. The 3D engine is reset with new camera information related to the image every time a new image is displayed, and only the screen coordinates of each corner is recomputed. All other information such as properties bound to the original objects are retained. During the editing process, some or all the object elements are modified or destroyed. To maintain the association of an object's attributes with its 3D shapes, a property of the 3D object is needed to link the object to its attributes with a minimum amount of overhead during the editing process. One example of a unique property is the geometric center (refer below) of that 3D shape using real world coordinates. By computing the centroid, a link may be formed between the attributes and the 3D shape without unnecessary overhead. This linkage is important when there are multiple 3D shapes in the same view that may either be touching of overlapping one another. One example of computing the Geometric center is:

$$C(x, y, z) = \frac{1}{n}\sum_{n}x_I, \frac{1}{n}\sum_{n}y_I, \frac{1}{n}\sum_{n}z_i,$$

where i is each individual point of the 3D shape.

If the centroid of an existing 3D object changes during the editing process, it is an indicator that the 3D object has changed allowing the system to ask if the 3D object should be saved prior to an exit from the system.

3D Model Change Detection

A Digital Surface Model (DSM) is defined here as a 3D regular grid or triangulated mesh. In the case of photogrammetry, the DSM is typically created from point clouds using dense matching algorithms applied to stereo imagery. A DSM GeoTiff is an elevation model stored in an image format wherein each pixel is the elevation of the pixel. Point clouds are also generated directly with LIDAR or similar active sensors.

Man-made structures/objects are typically well defined by DSM constructs but converting these constructs to geometric facets is needed for quantitative and qualitative comparison of detailed changes to the structures/objects over time. U.S. Pat. No. 7,728,833 B2 "Method for generating a three-dimensional roof structure" (which is incorporated by reference) identifies several methods for generating planar surfaces from LiDAR point clouds.

The invention automates construction of 3D model planar surface facets by combining a neighborhood of DSM triangles which fall in the same plane. The distance from any point to a plane may be determined with the "ray-to-plane" intersection formula. Any given DSM triangle forms a portion of a potential man-made structure if the distance from a neighboring point normal to the triangle is less than a given tolerance to the plane formed by the triangle. If the point is in the same plane, the facet may be expanded to include the neighboring point. A simple formula defines whether a point falls in the same plane: A plane in 3-D is commonly defined as a quadruple of numbers (a, b, c, & d). Any point P=(X, Y, Z) lies in the plane if a*X+b*Y+c*Z=d. By analyzing color variations, facet slope, and distance above ground, 3D facets are automatically generated and categorized for comparison with the existing 3D model or subsequent editing with the 3D perspective sketching module.

A final 3D model for each structure/object is defined by a minimum number of planar surfaces. These planar surfaces or facets are defined as polygons with real-world coordinates such as WGS84xyz coordinates. The ray-to-plane intersection formula computes "depth" by ray intersection with the drawing plane which may be a vertical wall, a roof facet, or just the selected pixel within a DSM triangular facet. Wall facets are automatically created vertical to the foundation facets. Automated roof facets automatically match the various slopes of the roof structure. However, both roof and wall facets may be edited to match the geometry when the 3D object is displayed in a specific perspective image or perspective view of a 3D point cloud or DSM.

The invention allows the draftsperson to draw in any perspective image view of the structure using spatially accurate imagery, point clouds, or previously created 3D models. Viewing point clouds in natural image perspective views often provides a better understanding of the details and makeup of man-made structures. This capability is useful for accurately modeling and editing real world objects shown in natural image and/or 3D point clouds and/or Digital Surface models.

Digital Surface Models are normally generated from only stereo nadir imagery. Without the ability to measure overlapping structure components, the value of the derived measurements is limited. To facilitate a full definition of the 3D model, Perspective View Drafting allows alignment and editing of partial 3D models in different perspective views of the structure/object including an orthographic DSM GeoTiff. This capability applies to accurate modeling and editing real-world objects shown in natural image and/or 3D point clouds and/or Digital Surface models.

Perspective View Drafting provides efficient creation and editing of real-world objects directly in a perspective view of the scene where the object consists of a series of 3D triangles or 3D polygon facets defining the object. The objects defined may represent cylinders, cones, spheres or any other mathematical object that may be used to define natural or man-made structures. A mathematical object is an abstract object defined by numbers, permutations, matrices, sets, functions, and relations. A mathematical object is anything that has been (or could be) formally defined, and with which one may do deductive reasoning and mathematical proofs. The invention relies on the ray-to-plane intersect with either a digital elevation model or any object defined by 3D triangles or 3D facets whether imported or created by the system by the methods described herein.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention will not be limited to the particular embodiment(s) disclosed, but that the invention will include all embodiments falling within the scope of the appended claims.

The invention claimed is:

1. A method for creating and managing a repository of four-dimensional (4D) property models and 4D structure models of existing human-made structures for a community of users scalable across large geographic areas in a shared 4D Geographic Information System, the method comprising:

receiving periodic new spatially accurate geometric information for human-made managed structures;

wherein the managed structures are human-made structures of a specified category, and wherein a managed area is defined as a given scalable geographic project area;

wherein the new spatially accurate geometric information includes new spatially accurate imagery that is comprised of a plurality of two-dimensional (2D) perspective view images of at least part of each human-made structure; and wherein image data about each of the plurality of two-dimensional perspective view images includes a geographic location and orientation from which each image was captured and calibration data for each image;

locating the managed structures in the managed area;

wherein three-dimensional (3D) geometric plane creation drawing tools are used to derive or update 3D model mathematical objects from the new spatially accurate geometric information;

retrieving most recent versions of all existing 4D property models and 4D structure models of the managed structures defined by mathematical objects and attributes of the structures from the repository of 4D property models and 4D structure models for the managed area;

determining current revision status of all current 3D structure models of the managed structures for the managed area;

wherein each 3D structure model is overlaid on the new spatially accurate geometric information to confirm a revision status for the 3D structure model, wherein each 3D structure model has one and only one revision status at any given time, and wherein the revision status of each 3D structure model is selected from the following group:

unchanged, when correct;

modified, when changed to be correct;

added, when missing; and deleted, when the 3D structure model is no longer relevant;

storing new 3D structure models with a capture date of the new spatially accurate geometric information, its attributes, revision status, and a unique identifier; wherein the revision status for each 3D structure model for each of the managed structures in the managed area becomes available to the community of users;

determining at least one derived attribute of all 3D property models and the 3D structure models within the managed area before or after transmission; and providing interactive access to all 4D property models or 4D structure models for historical, current, or proposed versions of the 4D property models or the 4D structure models within the managed area.

2. The method of claim 1, and further comprising:

receiving the new spatially accurate geometric information on a periodic basis for the managed area from which the 3D property models and the 3D structure models of all physical structures are automatically created for the managed area, wherein the new spatially accurate geometric information includes property boundaries, orthographic imagery, 2D perspective view images, LiDAR point clouds, or Digital Surface Model (DSM) point clouds of the managed area;

creating at least a portion of each 3D structure model based upon the new spatially accurate geometric information and the mathematical objects, wherein the mathematical objects are determined using a formula N·P=d to combine 3D triangles in a plane;

wherein N is a vector that is normal to the plane;

wherein P is a point in the plane;

wherein d is a scalar distance from an origin to the point in the plane;

wherein a formula $L=\|D\|^2/U·D$ is used to determine final coordinates for common edges of one or more different 3D polygons joined by analyzing color variations, facet slope, and distance above ground;

wherein L is a distance to the plane from a perspective view origin along vector U;

wherein D is a vector normal to the plane from the perspective view origin; and wherein the 3D polygons are categorized for comparison with a new 3D property model and the existing 3D structure models at a same location to determine the revision status; and storing a temporary version of each 3D property model and 3D structure model with its categorized revision status, its unique identifier, and the capture date of the new spatially accurate geometric information in the repository of 4D property models and 4D structure models for further review and finalization.

3. The method of claim 1, wherein the attributes of the structures retrieved from the repository of 4D property models and 4D structure models for the managed area include at least one of a geographic location, a date, a year built, a classification, a rating, photos, dimensions, size or value of the structure.

4. The method of claim 1, wherein the attributes of the structures retrieved from the repository of 4D property models and 4D structure models for the managed area include at least one of links to pricing information, sales information, pictures, movies, live video feeds or information that describes or shows an interior of the physical structure, or an exterior surrounding of the physical structure.

5. The method of claim 1, wherein the geographic location and orientation of the image data of at least one of the plurality of two-dimensional perspective view images is determined from a moving platform.

6. The method of claim 1, wherein the 3D structure models are created or edited in a user-controlled perspective view and the received new spatially accurate geometric information includes a point cloud, digital surface model, or imported 3D structure model of a physical structure corresponding to the respective 3D structure model.

7. The method of claim 1, wherein the 3D structure models are at least partially created or edited in a perspective view of an orthographic digital surface model or an orthographic image of a physical structure corresponding to the respective 3D structure model.

8. The method of claim 1, wherein the received new spatially accurate geometric information includes a point cloud, digital surface model, and/or an existing 3D model of at least one physical structure, and wherein at least one of the new 3D structure models includes mathematical objects that are at least in part automatically created.

9. The method of claim 1, wherein 2D scanned drawings of 2D wireframes of physical structures are converted at least in part to 3D vector graphics and projected into a perspective or orthographic view photograph for editing a corresponding one of the 3D structure models.

10. The method of claim 1, further comprising:
modifying at least one of the 3D structure models to show and/or evaluate desired changes including at least one of alternative windows, doors, siding, roofing material, wall material, or complete additions.

11. The method of claim 1, further comprising:
defining at least one of the new 3D structure models using a previous 3D structure model as a template defined at any geographic location that is movable to another geographic location and/or combined with another 3D structure model.

12. The method of claim 1, wherein a 3D Geographic Information System is integrated with processes that facilitate automated data gathering or transmission to/from desktop computers, compute intensive servers, and/or wireless mobile computers.

13. The method of claim 12, further comprising:
capturing or editing at least one of the 3D structure models and associated attribute data using a mobile platform with wireless connection to the 3D Geographic Information System.

14. The method of claim 13, wherein the mobile platform has a LiDAR sensor and/or a 3D camera for capturing measurements.

15. The method of claim 13, wherein the mobile platform has a LiDAR sensor and/or 3D camera for capturing video or perspective view images that are used to create or modify existing photorealistic 3D structure models in real-time.

16. The method of claim 1, further comprising:
determining at least one derived attribute of at least one of the 3D structure models by including the geographic location together with revision date of any attribute data including at least one of classification, rating, geometric properties, prior inspections, or valuation.

17. The method of claim 16, wherein determining the at least one derived attribute comprises utilizing at least one of:
elements that are mathematically determined, the mathematically determined elements including at least one of dimensions, direction, slope, area, and volume;
elements that are automatically determined based on image analysis; and
elements that are visually determined, the visually determined elements including at least one of material type, material quality, structure construction type, structure descriptor, and structure classification.

18. The method of claim 1, further comprising:
archiving and tracking structure geometric updates and/or attribute updates using a revision control module as a mechanism for change management and historical retrieval.

19. The method of claim 1, further comprising:
maintaining proposed alternative structural revisions simultaneously to compare visual and/or alternative costs associated with each alternative revision.

20. The method of claim 1, further comprising:
comparing, by a change management module, 3D structure model locations, component sizes, and associated attributes for same or different physical structures through time.

21. The method of claim 1, further comprising:
uniquely linking, by a change management module, information with other systems for tracking relevant updates corresponding to information attribute data received from or transmitted to external systems.

22. The method of claim 1, further comprising:
assigning project tasks dynamically upon work request based on one or more of predefined steps, worker qualifications and other priorities and preferences.

23. The method of claim 1, further comprising:
generating and tracking work assignments for reviewing the 3D structure models and/or attribute changes based on priorities including increased value or other attributes that have occurred between two dates within a geographic area.

24. The method of claim 23, wherein work assignment progress history is reported by worker and/or work group together with quality control results.

25. The method of claim 1, further comprising:
reporting project progress history showing people hours worked by time per period and projected completion dates with current allocation of workers and a number of workers required for project completion by a specified date.

26. The method of claim 1, further comprising:
displaying 3D structure model components together with available imagery showing optional attributes.

27. The method of claim 1, further comprising:
displaying one or more 3D structure model components in at least one of:
perspective view; and
orthogonal view.

28. The method of claim 1,
wherein the received new spatially accurate geometric information is one of a point cloud or digital surface model;
wherein providing the interactive access to all 4D structure models comprises providing interactive access to one or more 3D structure models with one or more versions of the one or more 3D structure models and geometric information; and
wherein at least one of interactive 3D measurements and repairs, and work to be performed is identified with an itemized attribute bill of materials including associated replacement or alternative design costs.

29. The method of claim 1, further comprising:
displaying 3D structure model geometric properties as part of a wireframe of at least one of the 3D structure models.

30. The method of claim 1, further comprising:
displaying 3D structure model attributes as a color-coded wireframe of at least one of the 3D structure models.

31. The method of claim 1, further comprising:
generating, by a change management module, at least one of an audit report and associated links to discrepancies found by comparing external attribute data to data accessible to the community of users.

32. The method of claim 1, further comprising:
identifying, by a change management module, objects of interest that are within a specified distance from physical structure components within the managed area.

33. The method of claim 1, further comprising:
uniquely identifying, by a change management module using a metadata key or keys registered to a universal property identifier that includes a direct or indirect embedded centroid, at least one of a property boundary and a location of physical structures within the property boundary.

34. The method of claim 1, further comprising:

identifying, by a communication notifications module, repairs or work to be inspected or completed with links to property documentation together with a bill of materials.

\* \* \* \* \*